(12) United States Patent
Sonoda et al.

(10) Patent No.: US 9,299,946 B2
(45) Date of Patent: Mar. 29, 2016

(54) DISPLAY SUBSTRATE, ORGANIC ELECTROLUMINESCENT DISPLAY DEVICE, AND MANUFACTURING METHOD FOR DISPLAY SUBSTRATE AND ORGANIC ELECTROLUMINESCENT DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 14/008,535

(22) PCT Filed: Mar. 27, 2012

(86) PCT No.: PCT/JP2012/058009
§ 371 (c)(1),
(2), (4) Date: Sep. 27, 2013

(87) PCT Pub. No.: WO2012/133458
PCT Pub. Date: Oct. 4, 2012

(65) Prior Publication Data
US 2014/0014985 A1    Jan. 16, 2014

(30) Foreign Application Priority Data
Mar. 31, 2011  (JP) ................................. 2011-081173

(51) Int. Cl.
*H01L 33/14* (2010.01)
*H01L 51/50* (2006.01)
(Continued)

(52) U.S. Cl.
CPC .......... *H01L 51/504* (2013.01); *H01L 27/3213* (2013.01); *H01L 27/3218* (2013.01); *H01L 51/56* (2013.01); *H05B 33/145* (2013.01); *H01L 27/3244* (2013.01); *H01L 51/5265* (2013.01)

(58) Field of Classification Search
CPC ............ H01L 27/3244; H01L 27/3213; H01L 33/145
See application file for complete search history.

(56) References Cited

U.S. PATENT DOCUMENTS

| 6,288,486 B1 | 9/2001 | Tsuruoka et al. |
| 6,294,892 B1 | 9/2001 | Utsugi et al. |

(Continued)

FOREIGN PATENT DOCUMENTS

| JP | 10-012380 A | 1/1998 |
| JP | 10-102237 | 4/1998 |

(Continued)

OTHER PUBLICATIONS

International Search Report received for PCT Patent Application No. PCT/JP2012/058009, mailed on Jun. 19, 2012, 6 pages (3 pages of English Translation and 3 pages of ISR).

*Primary Examiner* — Matthew Reames
(74) *Attorney, Agent, or Firm* — Morrison & Foerster LLP

(57) ABSTRACT

TFT substrate (10) includes a plurality of pixel regions each including light emitting regions of at least three colors, which light emitting regions include light emitting layers (23R(1), 23G, 23R(2), and 23B), respectively, and two adjacent ones of the light emitting regions are a combination other than a combination of (i) a light emitting region included in a light emitting layer (23G) of a color having a highest current efficiency in a case where the light emitting layers of the light emitting regions of the at least three colors emit light having an identical luminance and (ii) a light emitting region included in a light emitting layer (23B) of a color having a lowest current efficiency in a case where the light emitting layers of the light emitting regions of the at least three colors emit light having an identical luminance.

11 Claims, 16 Drawing Sheets

(51) Int. Cl.
  *H05B 33/14* (2006.01)
  *H01L 51/56* (2006.01)
  *H01L 27/32* (2006.01)
  *H01L 51/52* (2006.01)

(56) References Cited

U.S. PATENT DOCUMENTS

2004/0036421 A1  2/2004  Arnold et al.
2006/0274090 A1  12/2006  Koyama et al.
2008/0316235 A1  12/2008  Okazaki et al.
2009/0195144 A1  8/2009  Kitabayashi

FOREIGN PATENT DOCUMENTS

| JP | 11-067454 A | 3/1999 |
| JP | 2000-188179 | 7/2000 |
| JP | 2004-079538 A | 3/2004 |
| JP | 2006-309182 A | 11/2006 |
| JP | 2007/234241 A | 9/2007 |
| JP | 2009-187730 A | 8/2009 |
| JP | 2010/186582 A | 8/2010 |
| WO | WO-2006/019025 A1 | 2/2006 |

FIG. 6
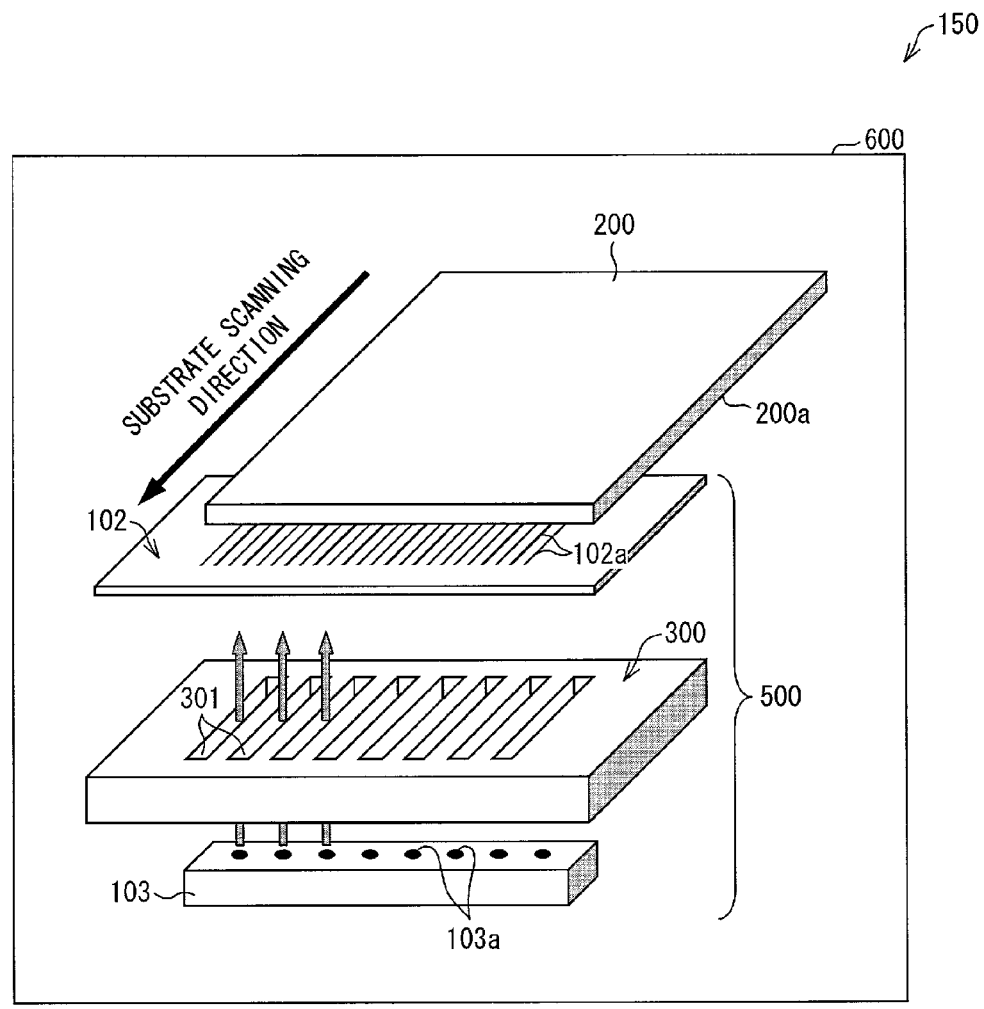
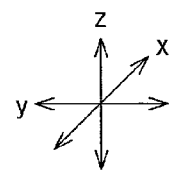

F I G. 1 6
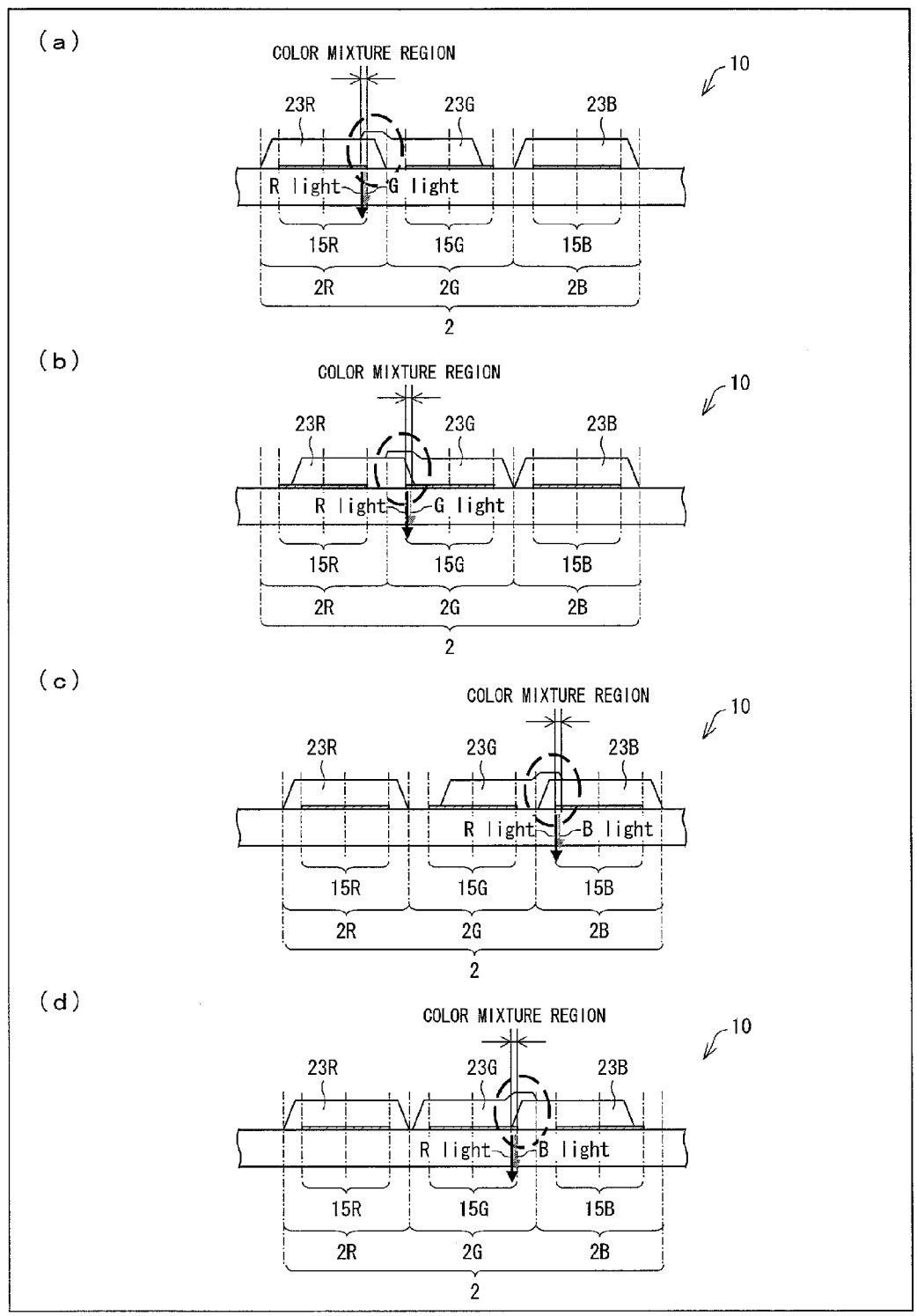

F I G. 1 8
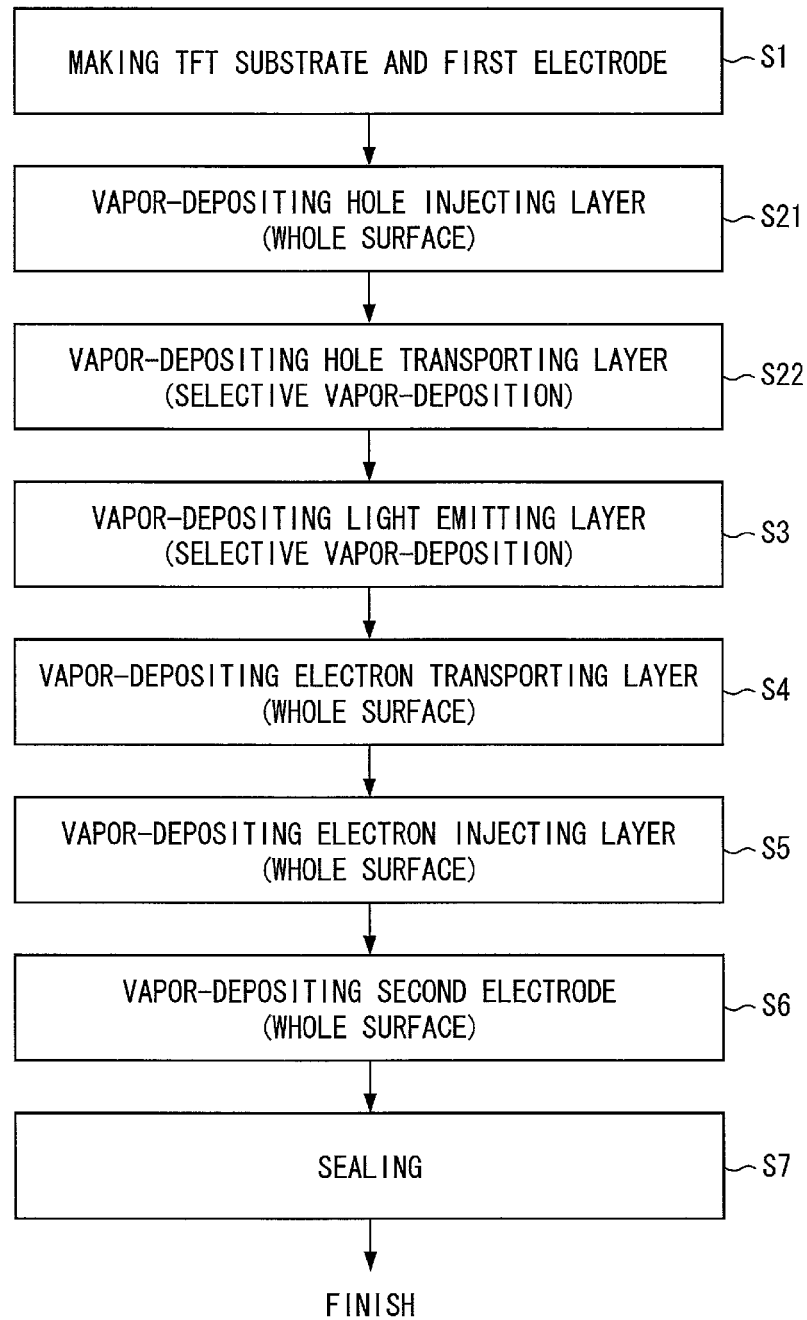

DISPLAY SUBSTRATE, ORGANIC ELECTROLUMINESCENT DISPLAY DEVICE, AND MANUFACTURING METHOD FOR DISPLAY SUBSTRATE AND ORGANIC ELECTROLUMINESCENT DISPLAY DEVICE

CROSS REFERENCE TO RELATED APPLICATIONS

This is a U.S. National Phase patent application of PCT/JP2012/058009, filed Mar. 27, 2012, which claims priority to Japanese patent application no. JP 2011-081173, filed Mar. 31, 2011, each of which is hereby incorporated by reference in the present disclosure in its entirety.

TECHNICAL FIELD

The present invention relates to a vapor-deposition technique for forming a vapor-deposited film having a predetermined pattern on a display substrate, and, specifically, relates to a display substrate, an organic electroluminescence display device, and methods of producing the same, each of which employs such a vapor-deposition technique.

BACKGROUND ART

Flat panel displays have been used in various products and fields in recent years, and are required to be larger in size, to have higher definition, and to consume less power.

In view of the circumstances, an organic EL display device including an organic EL element which employs electroluminescence (hereinafter, referred to as "EL") of an organic material draws significant attention as an all-solid flat panel display which is excellent in low voltage driving, rapid response, light emitting property, etc.

The organic EL display device has, for example, an arrangement in which an organic EL element connected to a thin film transistor (TFT) is provided on a substrate made from, for example, a glass substrate providing the TFT thereon.

The organic EL element is a light emitting element capable of emitting light of high luminance by low-voltage direct-current driving, and includes a first electrode, an organic EL layer, and a second electrode which are stacked in this order. Among them, the first electrode is connected to the TFT.

An organic layer, in which a hole injecting layer, a hole transporting layer, an electron blocking layer, a light emitting layer, a hole blocking layer, an electron transporting layer, an electron injecting layer, etc. are stacked, is provided as the organic EL layer between the first electrode and the second electrode.

FIG. 19 is a schematic view illustrating an array of sub pixels of each pixel in a general full-color organic EL display device.

As illustrated in FIG. 19, the full-color organic EL display device is generally formed such that an organic EL element including a light emitting layer of R (red), an organic EL element including a light emitting layer of G (green), and an organic EL element including a light emitting layer of B (blue) are arrayed as sub pixels on a semiconductor substrate for display, such as a TFT substrate, and the full-color organic EL display device displays an image with use of the TFT by selectively causing the organic EL elements to emit light of desired luminance.

In production of such an organic EL display device, at least light emitting layers, made from an organic light emitting material which emits light of colors, are subjected to patterning for respective organic EL elements which are light emitting elements (see, e.g., Patent Literatures 1 and 2).

The organic EL elements are formed by stacking organic films by vapor-deposition, whereas the light emitting layers need to be vapor-deposited on sub pixels of each color.

For example, in a case of a low-molecular kind organic EL display (OLED), an organic film (organic layer) has been conventionally formed in different colors by a vapor-deposition method with use of a vapor-deposition mask.

As a method of forming a pattern on a light emitting layer, for example, there is known a vacuum vapor-deposition method with use of a vapor-deposition mask called "shadow mask". The vacuum vapor-deposition method is roughly divided into two methods: a method of forming a film while contacting a film formation substrate and a vapor-deposition mask with each other; and a scanning vapor-deposition method of forming a film while separating a film formation substrate and a vapor-deposition mask.

In the vacuum vapor-deposition method with use of a vapor-deposition mask as described above, a film formation substrate and a vapor-deposition source are subjected to patterning in such a way that (i) the substrate and the vapor-deposition source are located to be opposite to each other, (ii) an opening is made in the mask to correspond to a part of a pattern to be formed on a vapor-deposited region in order to prevent vapor-deposition particles from adhering to a region other than the part of the vapor-deposited region, and (iii) vapor-depositing the vapor-deposition particles on the substrate via the opening.

CITATION LIST

Patent Literatures

Patent Literature 1
Japanese Patent Application Publication, Tokukai, No. 2000-188179 A (Publication date: Jul. 4, 2000)
Patent Literature 2
Japanese Patent Application Publication, Tokukaihei, No. 10-102237 A (Publication date: Apr. 21, 1998)

SUMMARY OF INVENTION

Technical Problem

However, in a case where the vapor-deposition is carried out with use of a vapor-deposition mask as described above, there occur, for example, (i) a relative misplacement between a position of the vapor-deposition mask and a position of a film formation substrate, (ii) processing accuracy of an opening to be made in the vapor-deposition mask, (iii) pattern accuracy of the film formation substrate, and (iv) misplacement of the vapor-deposited film (i.e., a pattern misplacement of a light emitting layer) because of shaking of the substrate during scanning-vapor-deposition.

As a matter of fact, in a case where a pattern formation location of the vapor-deposited film is not displaced, vapor-deposited films formed in different colors are not superposed on each other on the light emitting region (see FIG. 19).

However, in order to prevent misplacement of the pattern formation location, it is necessary to remove influences of, for example, (i) the processing accuracy of the opening to be made in the vapor-deposition mask, (ii) the patterning accuracy of the film formation substrate, (iii) the shaking of the substrate during the scanning vapor-deposition. Therefore, an advanced technique is required.

In addition, in a case where the vapor-deposited film is displaced as described above and the misplacement of the vapor-deposited film falls outside a tolerance, the vapor-deposited film to be formed on a region of one sub pixel of two adjacent sub pixels intrudes into a region of the other sub pixel. This causes a vapor-deposited film pattern to be also formed on a light emitting region of the other sub pixel (see FIG. 20). Note that FIG. 20 is an example where a vapor-deposited film to be formed on a region of a sub pixel G of two adjacent sub pixels G and B intrudes into a region of the sub pixel B and therefore a vapor-deposited film pattern of a light emitting layer (G) is also formed on a light emitting region of the sub pixel B.

In a case where the light emitting layer is displaced as described above, the region of the other sub pixel, into which a vapor-deposited film intrudes, is affected by a color of the one sub pixel, which results in occurrence of such a phenomenon that a color of the other one sub pixel and the color of the one sub pixel are mixed with each other, i.e., so-called color mixture. The color mixture causes reduction in display quality, thereby reducing a yield rate of organic EL display devices.

In order to prevent the color mixture, non-light emitting regions between sub pixels should be increased, however, the increase in non-light emitting regions causes reduction in areas of light emitting regions of the sub pixels.

If the areas of the light emitting regions of the sub pixels are reduced as described above, luminance deteriorates more quickly with the passage of time because current density needs to be higher to obtain the same identical luminance. That is, service lives of organic EL display devices are shortened.

Furthermore, a displayed image becomes highly granulated. That is, a pattern cannot be seen uniformly, and is recognized as an aggregate of particles.

Therefore, because of the increase in non-light emitting regions between the sub pixels, a reliability and a display quality of organic EL display devices are reduced and the organic EL display devices cannot be produced with high-definition.

The present invention has been made in view of the above problems, and an object of the present invention is to provide a display substrate, an organic electroluminescence display device, and methods of producing the same, each of which can prevent reduction in display quality caused by misplacement of a vapor-deposited film without increasing non-light emitting regions.

Solution to Problem

In order to achieve the above object, a display substrate of the present invention includes: a plurality of pixel regions each including, as sub pixel regions, light emitting regions of at least three colors, each light emitting region being included in a light emitting layer made from a vapor-deposited film, two adjacent ones of the light emitting regions being a combination other than a combination of (i) a light emitting region included in a light emitting layer of a color having a highest current efficiency and (ii) a light emitting region included in a light emitting layer of a color having a lowest current efficiency, the highest current efficiency and the lowest current efficiency being efficiencies observed in a case where the light emitting layers of the light emitting regions of the at least three colors emit light having an identical luminance.

According to the above arrangement, two adjacent ones of the light emitting regions being a combination other than a combination of (i) a light emitting region included in a light emitting layer of a color having a highest current efficiency and (ii) a light emitting region included in a light emitting layer of a color having a lowest current efficiency, the highest current efficiency and the lowest current efficiency being efficiencies observed in a case where the light emitting layers of the light emitting regions of the at least three colors emit light having an identical luminance. Therefore, the present invention can reduce a difference in current efficiency between the two adjacent ones of the light emitting regions more than a conventional arrangement in which a light emitting region included in a light emitting layer of a color having the highest current efficiency is adjacent to a light emitting region included in a light emitting layer of a color having the lowest current efficiency.

With the arrangement that the display substrate has, in the process of the production of the display substrate, even if the vapor-deposited film of the one of the two adjacent light emitting regions intrudes into a region of the other light emitting region on which the vapor-deposited film is formed, a degree of color mixture (a degree of change in color) caused by such intrusion in the present invention can be reduced more than that in the conventional arrangement.

Therefore, according to the above arrangement, it is possible to prevent reduction in display quality caused by a misplacement of a vapor-deposited film without increasing non-light emitting regions.

In order to achieve the above object, a display substrate of the present invention includes: at least three vapor-deposited film patterns having different film thicknesses are formed in the same plane of the display substrate; and two adjacent ones of the at least three vapor-deposited film patterns are a combination other than a combination of the pattern having a thickest vapor-deposited film and the pattern having a thinnest vapor-deposited film.

According to the above arrangement, at least three vapor-deposited film patterns having different film thicknesses are formed in the same plane of the display substrate; and two adjacent ones of the at least three vapor-deposited film patterns are a combination other than a combination of the pattern having a thickest vapor-deposited film and the pattern having a thinnest vapor-deposited film. This reduces a difference between film thicknesses of the two adjacent ones of the at least three vapor-deposited film patterns in the present invention more than that in an arrangement in which the pattern having the thickest vapor-deposited film is adjacent to the pattern having the thinnest vapor-deposited film.

As a result, even if a vapor-deposited film having one of the two adjacent patterns intrudes into a region to which a vapor-deposited film having the other pattern is formed, a total thickness variation caused by such intrusion can be prevented by appropriately setting the thicknesses of the vapor-deposited films.

Therefore, it is possible to prevent reduction in display quality caused by misplacement of a vapor-deposited film without increasing non-light emitting regions.

An organic electroluminescence display device in accordance with the present invention includes any one of the display substrates in accordance with the present invention.

With this arrangement, it is possible to produce an organic electroluminescence display device having an effect brought by any one of the above arrangements.

In order to achieve the above object, in a display substrate of the present invention, the light emitting layers are formed so that (i) the light emitting regions are arranged in a two-dimensional direction, (ii) two adjacent ones of the light emitting regions, which are adjacent to each other in a one-dimensional direction, have a minimum difference in current efficiency, and (iii) the two adjacent ones of the light emitting regions, which are adjacent to each other in a direction orthogonal to the one-dimensional direction, have a minimum difference in current efficiency.

According to the method, in a case where a light emitting layer of one of the two adjacent ones of the light emitting regions intrudes into the other light emitting region, a degree of color mixture (a degree of change in color) caused by such intrusion can be minimized. This minimizes reduction in image quality.

A method of producing an organic electroluminescence display device in accordance with the present invention, includes the steps of: (a) forming an anode; (b) forming a cathode; and (c) forming vapor-depositing light emitting layers of at least three colors on a color-by-color basis, the step (c) being carried out between the step (a) and the step (b), wherein, in the step (c), the lower current efficiency a light emitting layer has, the earlier the light emitting layer is formed after the step (a), the lower current efficiency being efficiency observed in a case where the light emitting layers of the light emitting regions of the at least three colors emit light having an identical luminance.

Generally, the light emitting layer emits brighter light in a region near an anode, in other words, luminance becomes higher as the light emitting layer becomes nearer the anode.

In view of the circumstances, as described above, in the step (c), the lower current efficiency a light emitting layer has, the earlier the light emitting layer is formed after the step (a), the lower current efficiency being efficiency observed in a case where the light emitting layers of the light emitting regions of the at least three colors emit light having an identical luminance. Therefore, even if the color mixture occurs, an influence of the color mixture can be reduced.

Note that, in a case where a light emitting layer which intrudes into a region is nearer an anode than the other light emitting layer intruded by the light emitting layer, the light emitting layer which intrudes into the region emits brighter light. However, the light emitting layer near the anode has a lower current efficiency than the other light emitting layer. Therefore, the effect is canceled.

Therefore, even if the light emitting layer which intrudes into the region is nearer the anode or vice versa, the influence of the color mixture, if the color mixture occurs, can be reduced by forming the light emitting layers in the above order.

Accordingly, a vapor-deposited film of one of two adjacent ones of light emitting regions intrudes into a region of the other light emitting region on which a vapor-deposited film is formed, a degree of color mixture (a degree of change in color) caused by such intrusion in the present invention can be more reduced. As a result, it is possible to prevent reduction in image quality.

Advantageous Effects of Invention

As described above, a display substrate in accordance with the present invention includes: a plurality of pixel regions each including, as sub pixel regions, light emitting regions of at least three colors, each light emitting region being included in a light emitting layer made from a vapor-deposited film, two adjacent ones of the light emitting regions being a combination other than a combination of (i) a light emitting region included in a light emitting layer of a color having a highest current efficiency and (ii) a light emitting region included in a light emitting layer of a color having a lowest current efficiency, the highest current efficiency and the lowest current efficiency being efficiencies observed in a case where the light emitting layers of the light emitting regions of the at least three colors emit light having an identical luminance.

Further, a method of producing a display substrate including a plurality of pixel regions each including, as sub pixel regions, light emitting regions of at least three colors, each light emitting region being included in a light emitting layer made from a vapor-deposited film, the method in accordance with the present invention includes the step of: forming the light emitting layers such that a first light emitting layer(s) is sandwiched between a second light emitting layer and a third light emitting layer, which, in a case where all the light emitting layers of the light emitting regions of the at least three colors emit light having an identical luminance, second light emitting layer displays a color having a highest current efficiency, third light emitting layer displays a color having a lowest current efficiency, and first light emitting layer(s) displays/display a color(s) having a current efficiency (efficiencies) which is/are less than the highest current efficiency but more than the lowest current efficiency.

With the above arrangement and the above method, even if a vapor-deposited film of one light emitting region of two adjacent ones of light emitting regions intrudes into a region of a vapor-deposited film of the other light emitting region, it is possible to prevent a degree of color mixture (a degree of change in color) caused by such intrusion in the present invention than that in the conventional arrangement.

Therefore, it is possible to prevent reduction in display quality caused by misplacement of a vapor-deposited film without increasing non-light emitting regions.

Further, a display substrate in accordance with the present invention includes: at least three vapor-deposited film patterns having different film thicknesses are formed in the same plane of the display substrate; and two adjacent ones of the at least three vapor-deposited film patterns are a combination other than a combination of the pattern having a thickest vapor-deposited film and the pattern having a thinnest vapor-deposited film.

With the above arrangement, even if a vapor-deposited film having one of the two adjacent patterns intrudes into a region to which a vapor-deposited film having the other pattern is formed, a total thickness variation caused by such intrusion can be prevented by appropriately setting the thicknesses of the vapor-deposited films.

Therefore, with the above arrangement, it is possible to prevent reduction in display quality caused by misplacement of a vapor-deposited film without increasing non-light emitting regions.

Further, the organic electroluminescence display device in accordance with the present invention has any one of the display substrates.

Therefore, with the above arrangement, it is possible to provide an organic electroluminescence display device which prevents reduction in display quality caused by misplacement of a vapor-deposited film without increasing non-light emitting regions.

Further, a method of producing an organic electroluminescence display device in accordance with the present invention, includes the steps of: (a) forming an anode; (b) forming a cathode; and (c) forming vapor-depositing light emitting layers of at least three colors on a color-by-color basis, the step (c) being carried out between the step (a) and the step (b), wherein, in the step (c), the lower current efficiency a light emitting layer has, the earlier the light emitting layer is formed after the step (a), the lower current efficiency being efficiency observed in a case where the light emitting layers of the light emitting regions of the at least three colors emit light having an identical luminance.

According to the method, in a case where a vapor-deposited film of one of the two adjacent ones of the light emitting regions intrudes into a region of the other light emitting region on which a vapor-deposited film is formed, a degree of color mixture (a degree of change in color) caused by such intrusion can be minimized. This minimizes reduction in image quality.

Therefore, according to the method, it is possible to provide an organic electroluminescence display device which prevents reduction in display quality caused by misplacement of a vapor-deposited film without increasing non-light emitting regions.

BRIEF DESCRIPTION OF DRAWINGS

FIG. 6 is a perspective view illustrating a schematic arrangement of a main part of a vapor-deposition device for use in Embodiment 1 of the present invention.

Figure 9:
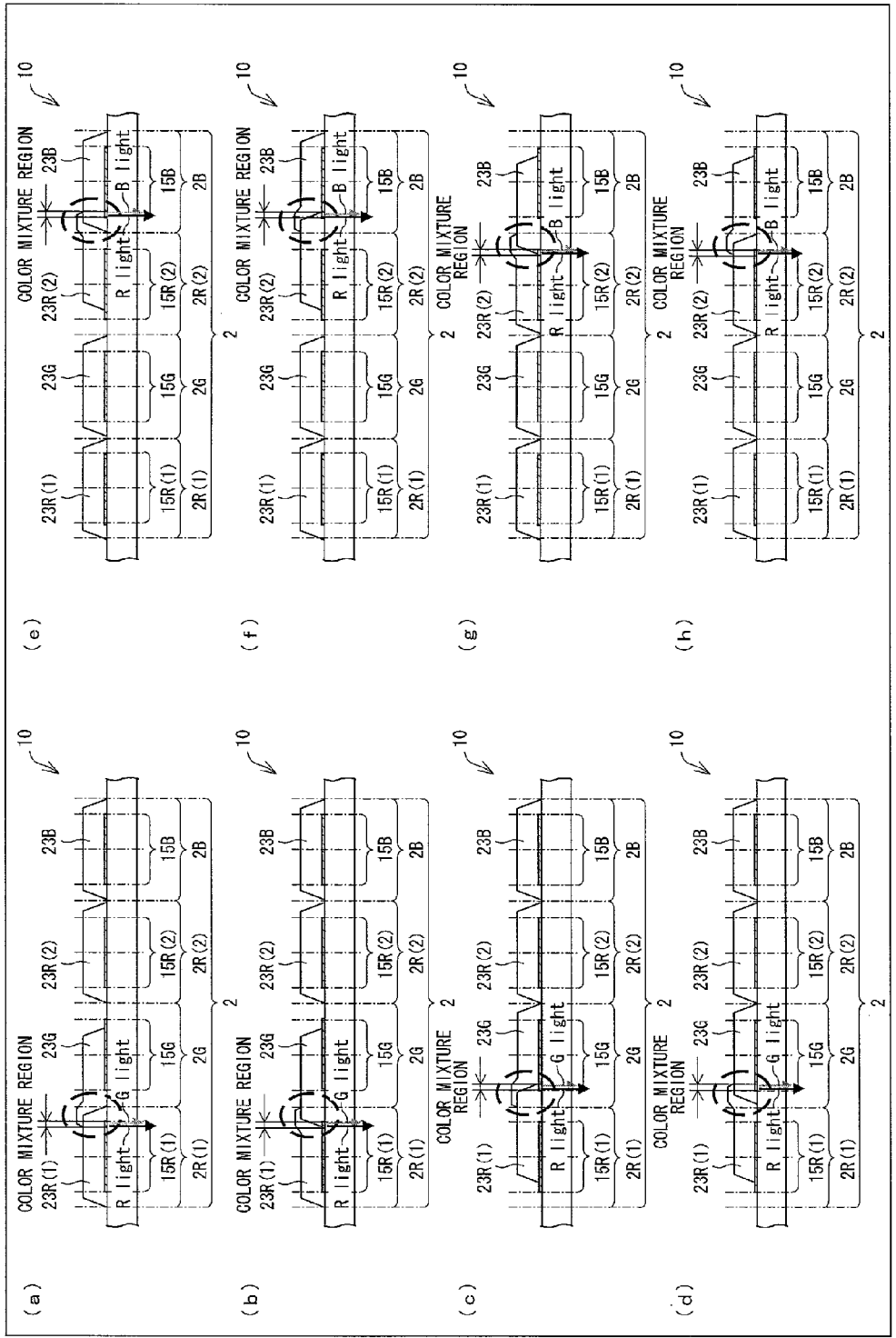

(a) through (h) of FIG. 9 are schematic views each showing, with use of an arrangement of a main part of a TFT substrate, an example where a light emitting layer of one of two adjacent sub pixels intrudes into a light emitting region of the other sub pixel.

Figure 10:
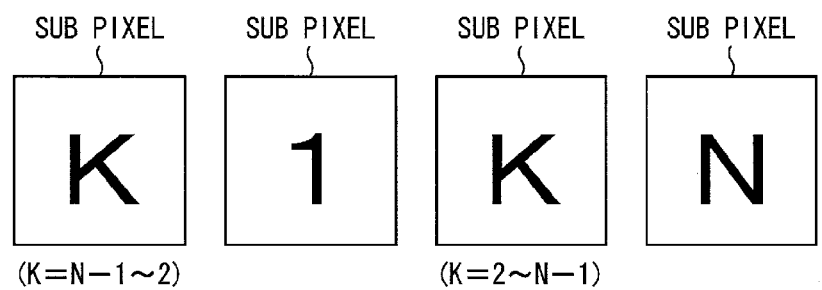

FIG. 10 is a schematic view illustrating an example where pixels are arrayed in a one-dimensional direction, each of which pixels is constituted by N(N is an integer of three or more) kinds of sub pixels in which vapor-deposited films are different in current efficiency.

Figure 11:
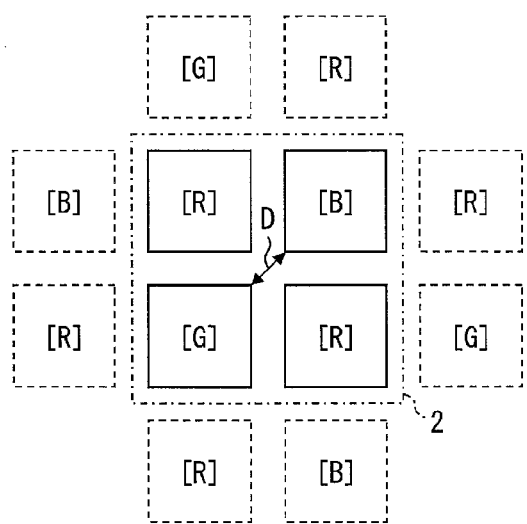

FIG. 11 is a schematic view illustrating an example array of sub pixels in accordance with Embodiment 2 of the present invention.

Figure 12:
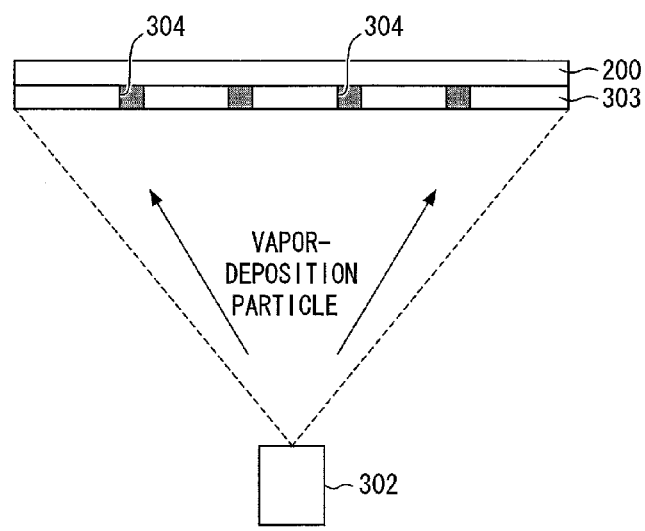

FIG. 12 is a schematic view illustrating an example vapor-deposition method for use in Embodiment 2 of the present invention.

Figure 13:
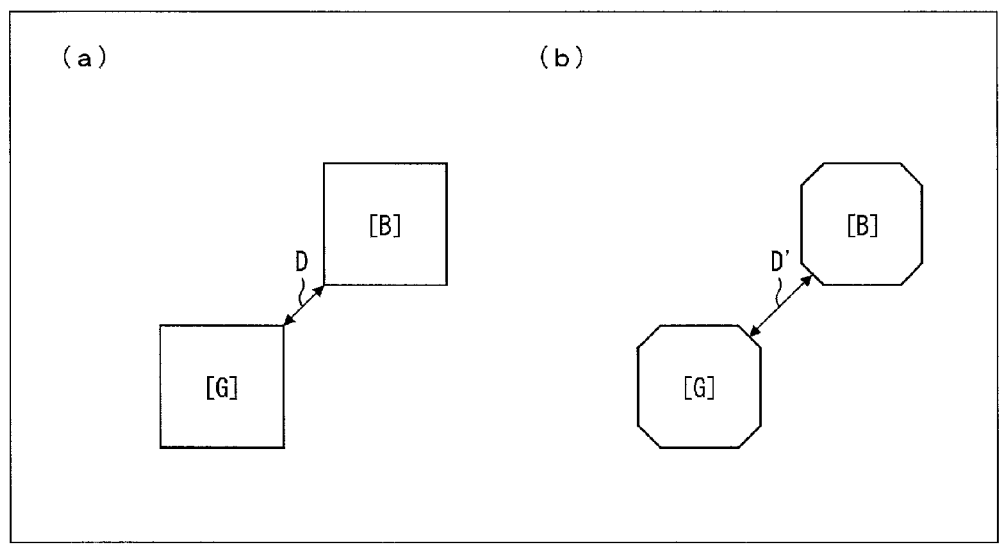

(a) and (b) of FIG. 13 are views illustrating an increase in clearance between sub pixels which are obliquely arranged, the increase being caused by a change in shape of a light emitting layer or change in shapes of the light emitting layer and a light emitting region.

Figure 14:
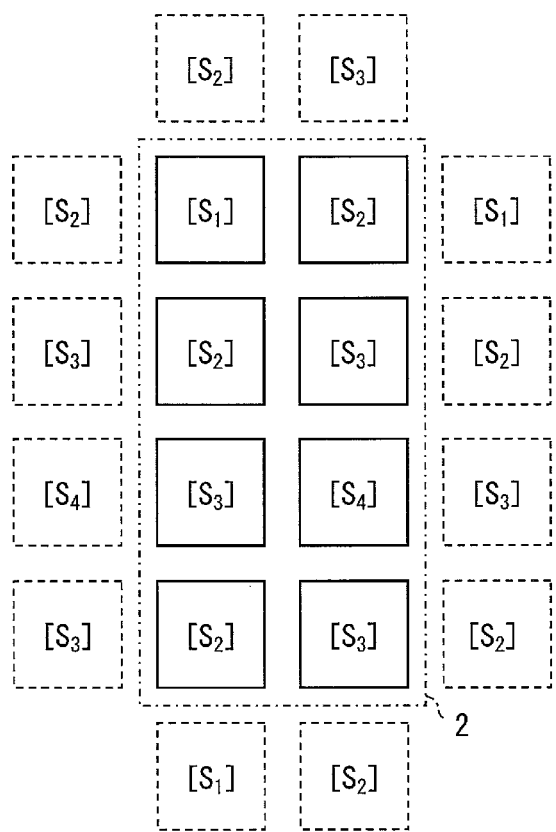

FIG. 14 is a view illustrating an example array of sub pixels in a case where the sub pixels of four colors constitute one pixel.

Figure 15:
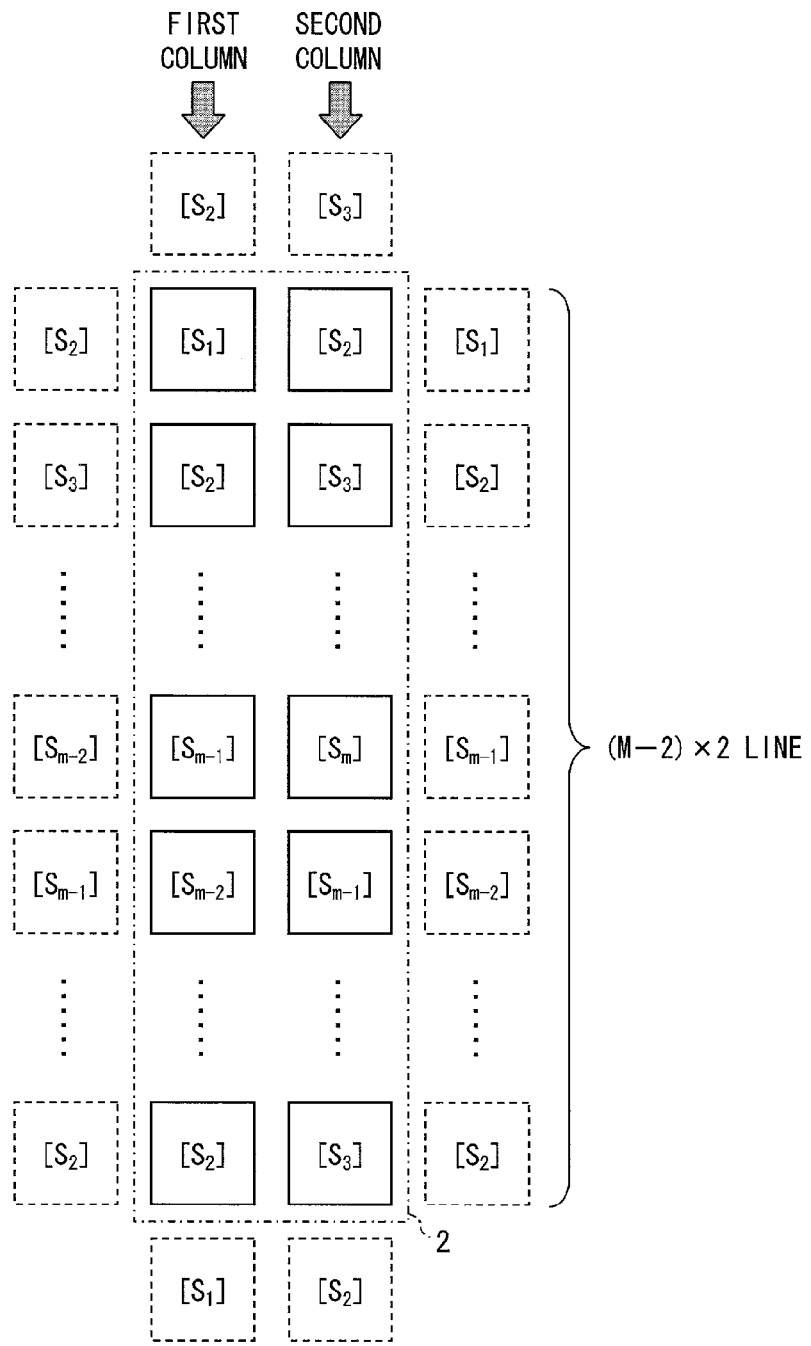

FIG. 15 is a view illustrating an example array of sub pixels in a case where the sub pixels of M colors constitute one pixel.

(a) through (d) of FIG. 16 are schematic views each illustrating a modification example of an array of sub pixels constituting one pixel in an organic EL display device in accordance with Embodiment 3 of the present invention.

Figure 17:
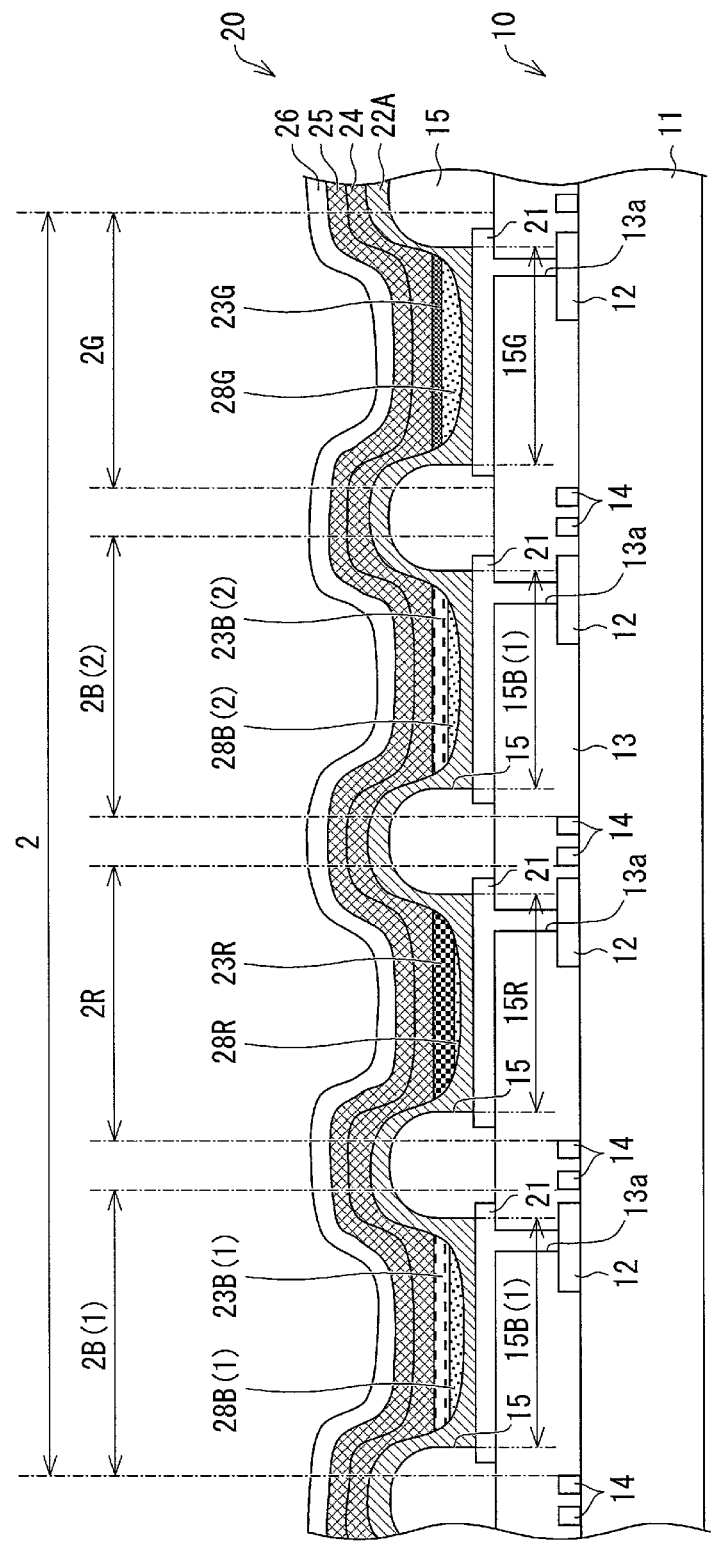

FIG. 17 is a cross-sectional view illustrating a schematic arrangement of an organic EL display device in accordance with Embodiment 4 of the present invention.

FIG. 18 is a flowchart showing steps of producing the organic EL display device of FIG. 17 in the order of steps.

Figure 19:
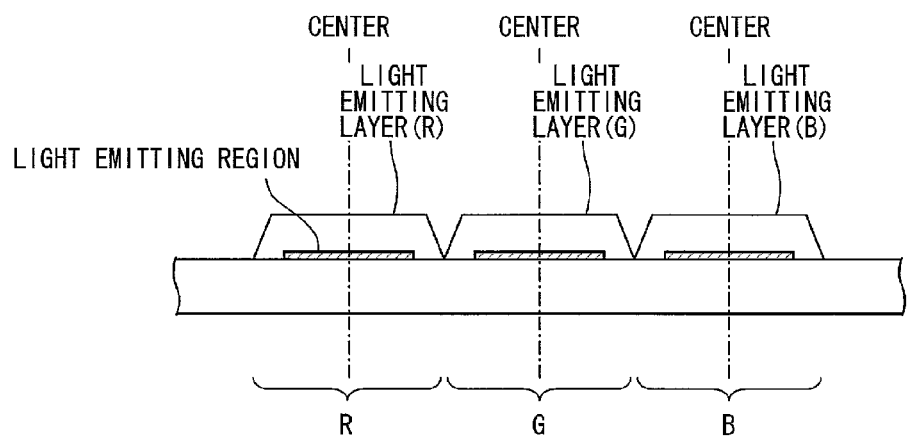

FIG. 19 is a schematic view illustrating an array of sub pixels of each pixel in a general full-color organic EL display device.

Figure 20:
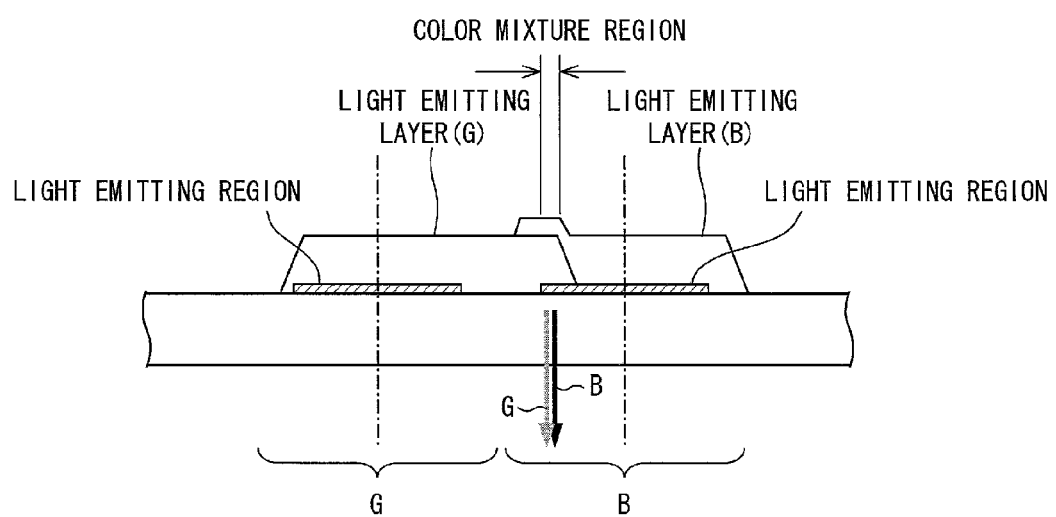

FIG. 20 is a view for explaining a problem of a conventional array of sub pixels.

DESCRIPTION OF EMBODIMENTS

The following description will discuss the present invention in detail.

[Embodiment 1]

Embodiment 1 will be described below with reference to FIG. 1 through FIG. 10.

<Schematic Arrangement of Organic EL Display Device>

Figure 4:
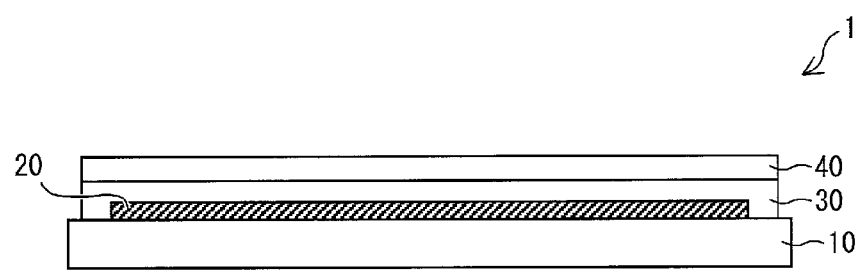
FIG. 4 is a cross-sectional view illustrating an arrangement example of the organic EL display device in accordance with Embodiment 1 of the present invention.

FIG. 4 is a cross-sectional view illustrating an arrangement example of an organic EL display device 1 in accordance with Embodiment 1.

The organic EL display device 1 of FIG. 4 includes a TFT substrate 10, organic EL elements 20, an adhesive layer 30, and a sealing substrate 40, and is a bottom-emission kind display device which extracts light from the TFT substrate 10 and is a RGB full-color kind display device.

A TFT and the like are formed as a switching element on a portion to be a pixel region of the TFT substrate 10.

The organic EL elements 20 are arranged on a display region of the TFT substrate 10 in matrix.

The TFT substrate 10, on which the organic EL element 20 is formed, is adhered to the sealing substrate 40 by use of the adhesive layer 30 and/or the like.

The following description will discuss in detail arrangements of the TFT substrate 10 and the organic EL elements 20 of the organic EL display device 1.

<Arrangement of TFT Substrate 10>

Figure 1:
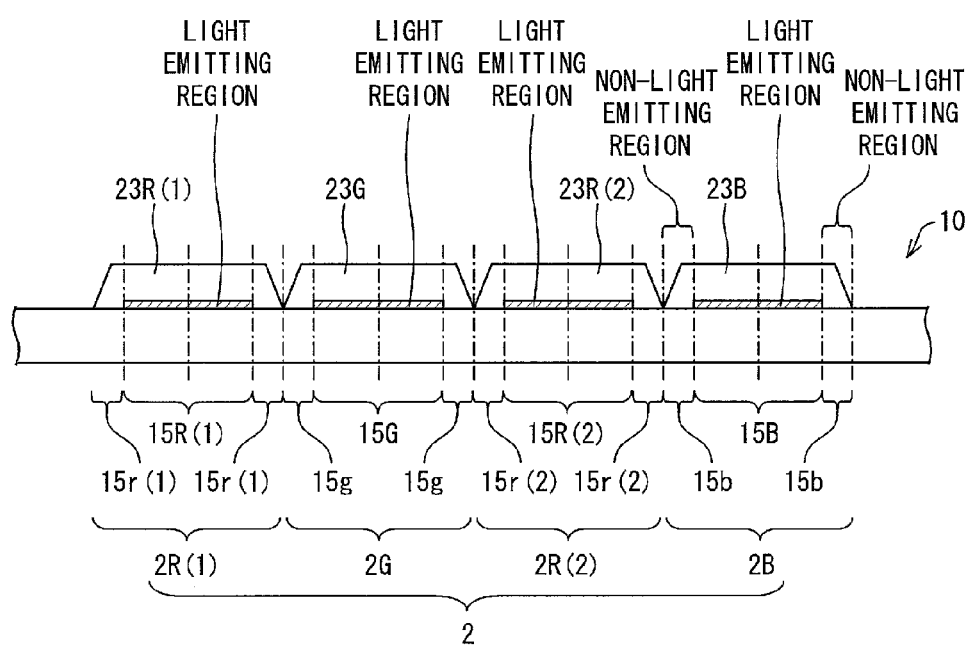
FIG. 1 is a schematic view illustrating an array of sub pixels constituting each pixel in an organic EL display device in accordance with Embodiment 1 of the present invention, which array is illustrated as an array of sub pixel regions in one pixel region of a TFT substrate of the organic EL display device.

FIG. 1 is a schematic view illustrating an array of sub pixels constituting each pixel in the organic EL display device 1 in accordance with Embodiment 1, which array is illustrated as an array of sub pixel regions in one pixel region of the TFT substrate 10 of the organic EL display device 1.

Note that the one pixel region of the TFT substrate 10 indicates a region corresponding to each pixel which is a minimum constituent unit needed for performing color display (in Embodiment 1, pixels for three primary colors) when a display panel is formed with use of the TFT substrate 10 (i.e., when the organic EL display device 1 is assembled).

Further, the sub pixel region of the TFT substrate 10 indicates a region corresponding to each sub pixel (dot) constituting one pixel which is a minimum constituent unit needed for performing color display when a display panel is formed with use of the TFT substrate 10 (i.e., the organic EL display device 1 is assembled).

Figure 2:
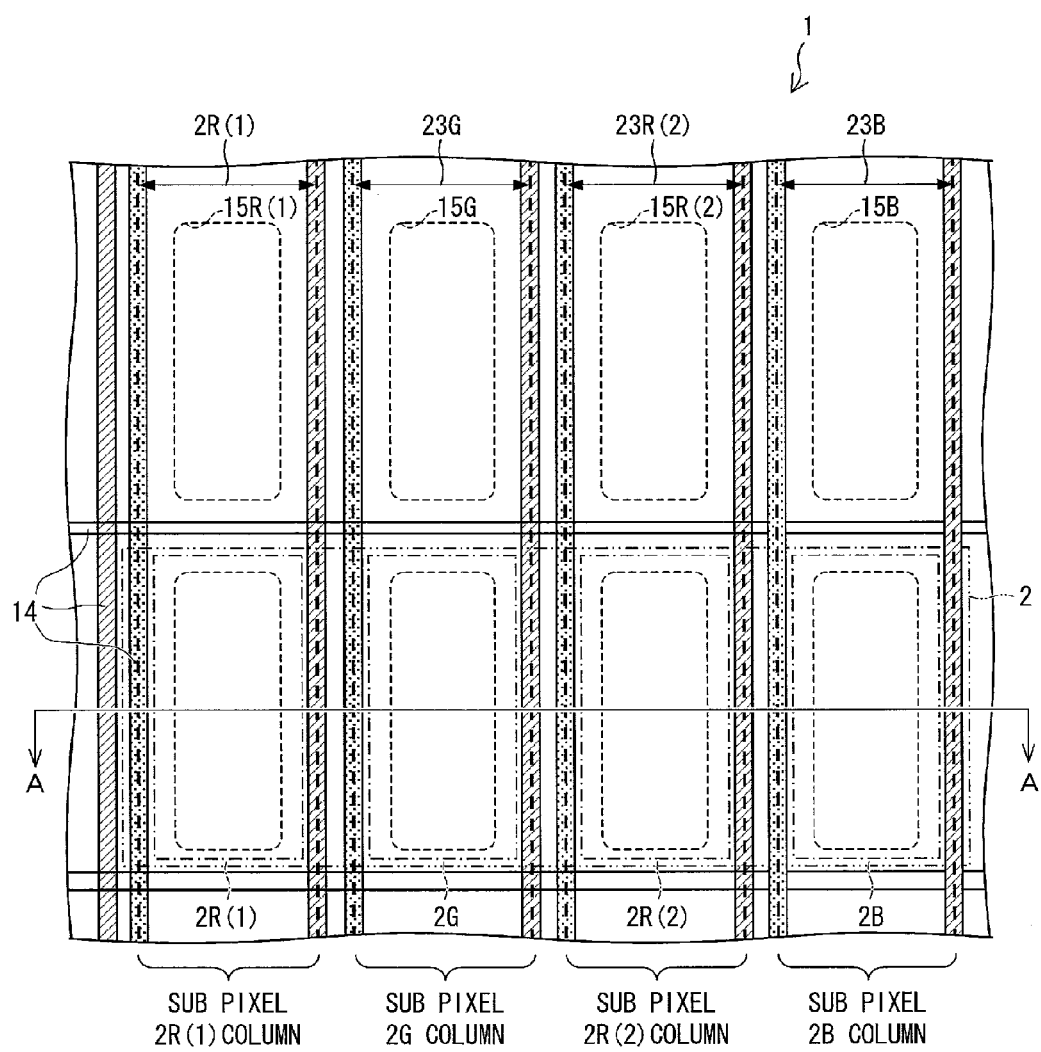
FIG. 2 is a plan view illustrating an arrangement of pixels constituting the organic EL display device in accordance with Embodiment 1 of the present invention.
Figure 3:
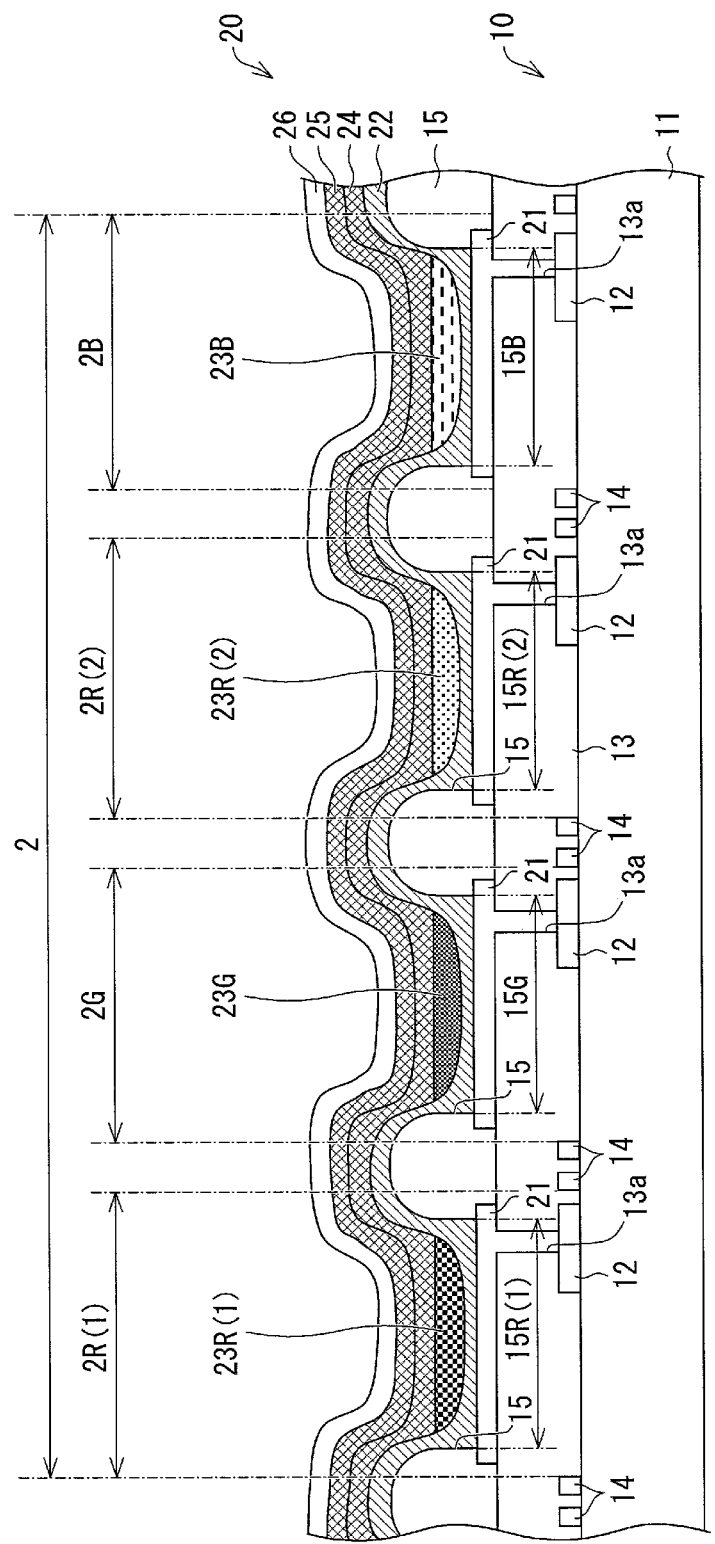
FIG. 3 is a cross-sectional view of the TFT substrate of the organic EL display device illustrated in FIG. 2, which cross-sectional view is taken along the line of A-A of FIG. 2.

Further, FIG. 2 is a plan view illustrating an arrangement of pixels constituting the organic EL display device 1. FIG. 3 is a cross-sectional view of the TFT substrate 10 of the organic EL display device illustrated 1 in FIG. 2, which cross-sectional view is taken along the line of A-A of FIG. 2.

Note that FIG. 1 corresponds to a schematic view of the array of the sub pixels of the TFT substrate 10 illustrated in FIG. 3, which schematic view is taken along the line A-A of FIG. 3.

As illustrated in FIG. 3, the TFT substrate 10 has an arrangement in which TFTs 12 (switching elements), interlayer insulating films 13, wires 14, edge covers 15, and the like are formed on a transparent insulating substrate 11 such as a glass substrate.

The organic EL display device 1 is a full-color active-matrix kind organic EL display device. As illustrated in FIG. 2 and FIG. 3, sub pixels 2R(1) and 2R(2) constituted by the organic EL elements 20 of red (R), a sub pixel 2G constituted by the organic EL element 20 of green (G), and a sub pixel 2B constituted by the organic EL element 20 of blue (B), each of which sub pixels is formed on a region surrounded by the wire 14, are arranged in matrix on the insulating substrate 11.

That is, each of the regions surrounded by the wires 14 is a single sub pixel (dot), and light emitting regions (light emitting sections) R, G, and B are defined for sub pixels, respectively.

A pixel 2 (i.e., one pixel) is constituted by four sub pixels 2R(1), 2G, 2R(2), and 2B. The red sub pixels 2 R(1) and 2R(2) emit light of red, the green sub pixel 2G emits light of green, and the blue sub pixel 2B emits light of blue.

The sub pixels 2R(1), 2G, 2R(2), and 2B include exposed sections 15R(1), 15G, 15R(2), and 15B, respectively, which are covered by striped light emitting layers 23R(1), 23G, 2R(2), and 23B, respectively, the exposed sections 15R(1), 15G, 15R(2), and 15B being included as light emitting regions for emitting light of colors of the sub pixels 2R(1), 2G, 2R(2), and 2B.

The light emitting layers 23R(1), 23G, 23R(2), and 23B are subjected to patterning on a color-by-color basis by vapor-deposition.

Each of the sub pixels 2R(1), 2G, 2R(2), and 2B provide the TFT 12 connected to a first electrode 21 in the organic EL element 20. Emission intensity of each of the sub pixels 2R(1), 2G, 2R(2), and 2B is determined by scanning of the wires 14 and selection of the TFTs 12. Therefore, the organic EL display device 1 can display an image by selectively causing the organic EL elements 20 to emit light of a desired luminance with use of the TFTs 12.

Each of the interlayer insulating films 13 is stacked on the insulating substrate 11 so that the interlayer insulating films 13 cover the TFTs 12 and the wires 14 over a whole region of the insulating substrate 11.

The first electrode 21 of the organic EL element 20 is formed on each of the interlayer insulating films 13.

Further, the interlayer insulating film 13 provides a contact hole 13a for electrically connecting the first electrode 21 of the organic EL element 20 to the TFT 12. Therefore, the TFT 12 is electrically connected to the organic EL element 20 via the contact hole 13a.

Each of the edge covers 15 is an insulating layer for preventing a short circuit between the first electrode 21 and a second electrode 26 of the organic EL element 20 because of reduction in thickness of an organic EL layer or generation of electric field concentration at an end(s) of the first electrode 21.

The edge cover 15 is formed to cover ends of the first electrodes 21 on the interlayer insulating film 13.

As illustrated in FIG. 2, portions of the first electrodes 21 of the sub pixels 2R(1), 2G, 2R(2), and 2B, which portions are portions where the edge covers 15 are not provided, are exposed.

The portions where the edge covers 15 are not provided, i.e., the exposed sections 15R(1), 15G, 15R(2), and 15B become light emitting regions (light emitting sections) of the sub pixels 2R(1), 2G, 2R(2), and 2B, respectively, as described above.

In other words, the sub pixels 2R(1), 2G, 2R(2), and 2B are partitioned by the edge covers 15 having an insulation property. The edge covers 15 also function as element isolation films.

As illustrated in FIG. 1, the sub pixels 2R(1), 2G, 2R(2), and 2B are constituted by (i) the light emitting regions (light emitting sections) provided in regions where the exposed sections 15R(1), 15G, 15R(2), and 15B, respectively, are formed and (ii) non-light emitting regions (non-light emitting sections) 15r(1), 15g, 15r(2), and 15b, respectively, are formed between the exposed sections 15R(1), 15G, 15R(2), and 15B.

Thus, in the TFT substrate 10, the light emitting regions provided in regions where the exposed sections 15R(1), 15G, 15R(2), and 15B of respective colors are included as sub pixel regions (i.e., a part of the sub pixel regions) constituting the sub pixels 2R(1), 2G, 2R(2), and 2B of the organic EL display device 1.

<Arrangement of Organic EL Element 20>

As illustrated in FIG. 3, the organic EL element 20 is a light emitting element capable of emitting light at a high luminance by low-voltage direct-current driving, and the first electrode 21, an organic EL layer, and the second electrode 26 are stacked on the organic EL element 20 in this order.

The first electrode 21 is a layer having a function to inject (supply) a hole to the organic EL layer. The first electrode 21 is connected to the TFT 12 via the contact hole 13a as described above.

Between the first electrode 21 and the second electrode 26, a hole injecting layer serving also as a hole transporting layer 22, the light emitting layers 23R(1), 23G, 23R(2), or 23B, an electron transporting layer 24, and an electron injecting layer 25, are formed, as the organic EL layer, on the first electrode 21 in this order (see FIG. 3).

Note that a carrier blocking layer (not shown) for blocking a flow of carriers such as holes and electrons may be inserted as necessary. Further, a single layer may have a plurality of functions, and, for example, a single layer functioning as a hole injecting layer and also as a hole transporting layer may be formed.

Note that a staking order of those layers is a configuration that the first electrode 21 serves as an anode and the second electrode 26 serves as a cathode. Conversely, for the configuration that the first electrode 21 serves as a cathode and the second electrode 26 serves as an anode, the order of the layers in the organic EL layer is inverted.

The hole injecting layer is a layer having a function to improve hole injection efficiency from the first electrode 21 to the organic EL layer. Further, the hole transporting layer is a layer having a function to improve hole transport efficiency to the light emitting layers 23R(1), 23G, 23R(2), and 23B. The hole injecting layer serving also as hole transporting layer 22 is uniformly formed on a whole display region of the TFT substrate 10 so as to cover the first electrode 21s and the edge covers 15.

Note that, in Embodiment 1, as described above, the hole injecting layer also serving as the hole transporting layer 22, into which a hole injecting layer and a hole transporting layer are integrated, is provided to function as both the hole injecting layer and the hole transporting layer. However, Embodiment 1 is not limited thereto, and the hole injecting layer and the hole transporting layer may be independently formed.

The light emitting layers 23R(1), 23G, 23R(2), and 23B are formed to correspond to the sub pixels 2R(1), 2G, 2R(2), and 2B, respectively, on the hole injecting layer also serving as the hole transporting layer 22.

Each of the light emitting layers 23R(1), 23G, 23R(2), and 23B is a layer having a function to emit light by causing a hole injected from a side of the first electrode 21 and an electron injected from a side of the second electrode 26 to recombine with each other. The light emitting layers 23R(1), 23G, 23R(2), and 23B are made from a material having high current efficiency such as a low-molecular fluorescent dye or a metal complex.

The current efficiency indicates a ratio of luminance emitted from the material to a current of a certain value when the current is flown per a unit area of the material, and is expressed by cd/A.

In Embodiment 1, in a case where light emitting regions of respective colors of the light emitting layers 23R(1), 23G, 23R(2), and 23B emit light having an identical luminance, a current efficiency of the light emitting layer 23G is the highest. The light emitting layer 23R(1) and the light emitting layer 23R(2) have the second highest current efficiency, and the light emitting layer 23B has the lowest current efficiency.

The electron transporting layer 24 is a layer having a function to improve electron transport efficiency from the second electrode 26 to the light emitting layers 23R(1), 23G, 23R(2), and 23B. The electron injecting layer 25 is a layer having a function to improve electron injection efficiency from the second electrode 26 to the organic EL layer.

The electron transporting layer 24 is uniformly formed on the light emitting layers 23R(1), 23G, 23R(2), and 23B and the hole injecting layer also serving as the hole transporting layer 22 over the whole display region of the TFT substrate 10 so as to cover the light emitting layers 23R(1), 23G, 23R(2), and 23B and the hole injecting layer also serving as the hole transporting layer 22.

The electron injecting layer 25 is uniformly formed on the electron transporting layer 24 over the whole display region of the TFT substrate 10 so as to cover the electron transporting layer 24.

Note that the electron transporting layer 24 and the electron injecting layer 25 may be independently formed as described above, or may be integrally formed. That is, the organic EL display device 1 may include a single layer serving as an electron transporting layer and also as an electron injecting layer instead of the electron transporting layer 24 and the electron injecting layer 25.

The second electrode 26 is a layer having a function to inject electrons to the organic EL layer constituted by the above organic layers. The second electrode 26 is uniformly formed on the electron injecting layer 25 over the whole display region of the TFT substrate 10 so as to cover the electron injecting layer 25.

Note that the organic layers other than the light emitting layers 23R(1), 23G, 23R(2), and 23B are not necessarily provided as the organic EL layer, and may be appropriately formed in accordance with demanded characteristics of the organic EL element 20.

Further, a single layer may have a plurality of functions, such as the hole injecting layer also serving as the hole transporting layer 22 and the electron transporting layer serving as the electron injecting layer.

A carrier blocking layer may be added to the organic EL layer as necessary. For example, a hole blocking layer is added as a carrier blocking layer between the light emitting layers 23R(1), 23G, 23R(2), 23B and the electron transporting layer 24, thereby preventing holes from transferring to the electron transporting layer 24. This makes it possible to improve luminous efficiency of each color.

In the above arrangement, layers other than the first electrode 21 (anode), the second electrode 26 (cathode), and the light emitting layers 23R(1), 23G, 23R(2), and 23B may be appropriately inserted.

<Arrangement of Sub Pixels>

Conventionally, pixels constituting the organic EL display device 1 have been arranged in a pattern of red (R), green (G), and blue (B).

On the contrary, in Embodiment 1, the sub pixels 2R(1) and 2R(2), each including a light emitting layer having the current efficiency lower than that of the light emitting layer 23G but higher than that of the light emitting layer 23B, are arranged between the sub pixel 2G including the light emitting layer 23G having the highest current efficiency and the sub pixel 2B including the light emitting layer 23B having the lowest current efficiency (see FIG. 1 to FIG. 3). Therefore, the sub pixels in the single pixel 2 are arranged in a pattern of red (R), green (G), red (R), and blue (B).

Note that, in Embodiment 1, in order to differentiate a sub pixel R adjacent to a sub pixel G in an conventional arrangement from the sub pixel R newly arranged between the sub pixel G and the sub pixel B in Embodiment 1, the former one is referred to as "sub pixel 2 R(1)", and the latter one is referred to as "sub pixel 2 R(2)".

With this arrangement above, even a light emitting layer of one of two adjacent sub pixels intrudes into a light emitting region of the other sub pixel, the present invention can prevent reduction in image quality caused by misplacement of light emitting layers, as compared with conventional inventions. This point will be described later.

<Circuit Configuration of Sub Pixel Driving Circuit>

A sub pixel driving circuit including the TFT 12 is provided on the insulating substrate 11 to correspond to each of the sub pixels 2R(1), 2G, 2R(2), and 2B.

Figure 5:
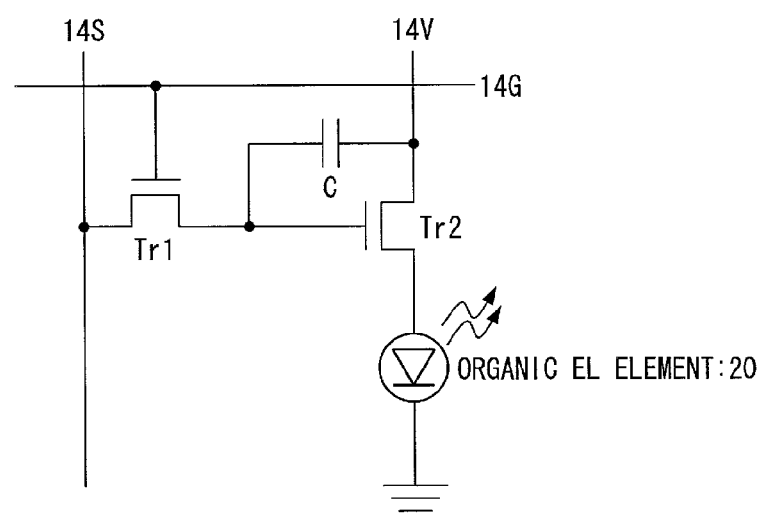
FIG. 5 is a view illustrating a circuit configuration of a sub pixel driving circuit which drives each sub pixel.

FIG. 5 is a view illustrating a circuit configuration of a sub pixel driving circuit which drives each sub pixel.

As illustrated in FIG. 5, the sub pixel driving circuit includes a transistor Tr1 for controlling, a transistor Tr2 for driving, and a capacitor C.

A source terminal of the transistor Tr1 is connected to a source line 14S. A gate terminal of the transistor Tr1 is connected to a gate line 14G. A drain terminal of the transistor Tr1 is connected to a gate terminal of the transistor Tr2.

A drain terminal of the transistor Tr2 is connected to a power supply wire 14V. A source terminal of the transistor Tr2 is connected to the organic EL element 20.

The capacitor C is located between the drain terminal of the transistor Tr2 and the gate terminal of the transistor Tr2. The capacitor C is a capacitor for retaining a voltage.

In the sub pixel driving circuit having the above arrangement, in order to write data, the gate line 14G becomes H (high) to cause the transistor Tr1 to be turned on. With this, a data voltage signal from the source line 14S is written to the capacitor C. Then, the gate line 14G becomes L (low) to cause the transistor Tr1 to be turned off. With this, the capacitor C and the source line 14S are disconnected, and the capacitor C retains the data voltage signal thus written.

A current of the transistor Tr2 is determined by magnitudes of voltages at ends of the capacitor C. Therefore, a current in accordance with the data voltage signal is supplied to the organic EL element.

Note that a configuration of each sub pixel driving circuit is not limited thereto. For example, in a case where a circuit for compensating for, e.g., characteristic variation and degradation over time of the transistors Tr1 and Tr2. In order to provide such a circuit, a wire(s) other than the gate line 14G, the source line 14S, and the power supply wire 14V is/are provided in some cases.

<Schematic Arrangement of Vapor-deposition Device>

FIG. 6 is a perspective view illustrating a schematic arrangement of a main part of a vapor-deposition device 150 for use in Embodiment 1.

As illustrated in FIG. 6, the vapor-deposition device 150 includes a mask unit 500 located in a vacuum chamber 600.

The mask unit 500 is constituted by a mask 102 for vapor-deposition (vapor-deposition mask), a vapor-deposition source 103, and a limiting plate 300 located between the mask 102 and the vapor-deposition source 103.

The mask 102, the vapor-deposition source 103, and the limiting plate 300 are integrally formed with use of a retaining member such as an identical holder, and relative positions between the mask 102, the vapor-deposition source 103, and the limiting plate 300 are fixed.

The vapor-deposition source 103 is located between the mask 102 and the limiting plate 300 so as to face the mask 102 and the limiting plate 300 while having a certain space with respect to (i.e., while separating a certain distance from) the mask 102 and the limiting plate 300.

The vapor-deposition source 103 generates gas-like vapor-deposition particles by heating and evaporating (in a case where the vapor-deposition material is a liquid material) or subliming the vapor-deposition material (in a case where the vapor-deposition material is a solid material).

A counter surface of the vapor-deposition source 103, which is directed toward the limiting plate 300 and the mask 102, has an injection port (through holes) 103a for emitting the vapor-deposition particles, and emits the gas-like vapor-deposition material as the vapor-deposition particles from the injection ports 103a.

Note that FIG. 6 illustrates an example where the vapor-deposition source 103 has a plurality of injection ports 103a, however, the number of injection ports 103a is not particularly limited, and at least one hole needs to be provided.

Further, the injection ports 103a may be arranged in one dimension (i.e., like a line) as illustrated in FIG. 6, or may be arranged in two dimension (i.e., like a surface (like tiles)).

Further, the vapor-deposition source 103 may include a heating vessel, referred to as "crucible", which directly houses the vapor-deposition material therein.

Alternatively, as another arrangement, the vapor-deposition source 103 may include a load lock pipe (not shown) and a vapor-deposition particle supply source (not shown) connected to the pipe, and may emit the vapor-deposition particles by supplying the vapor-deposition particles to a nozzle section in which the injection ports 103a are made.

The opening (through hole) 102a having a desired shape is formed at a desired position of the mask 102, and only the vapor-deposition particles which have passed the opening 102a of the mask 102 reach the film formation substrate 200 and form a vapor-deposited film.

Therefore, an organic film, having a desired vapor-deposition pattern at a desired location of the film formation substrate 200, is formed as a vapor-deposited film, which desired location corresponds to the opening 102a.

Note that FIG. 6 illustrates an example where a plurality of strip-like (striped, slit) openings 102a, which extend in a direction parallel to a scanning direction, are arranged in the mask 102.

As described above, in a case where a vapor-deposited film pattern is formed on each of the sub pixels 2R(1), 2G, 2R(2), and 2B in the film formation substrate 200, a fine mask whose opening 102a is made for each of the sub pixels 2R(1), 2G, 2R(2), and 2B is used as the mask 102.

Meanwhile, in a case where the vapor-deposited film pattern is formed on the whole display region of the film formation substrate 200, an open mask having an opening corresponding to the whole display region is used.

For example, the light emitting layers 23R(1), 23G, 23R(2), and 23B are formed as vapor-deposition patterns in the sub pixels 2R(1), 2G, 2R(2), and 2B. In this case, vapor-deposition is carried out for each color (i.e., for R, G, and B) of the light emitting layers 23R(1), 23G, 23R(2), and 23B (this vapor-deposition is referred to as "selective vapor-deposition").

In a case where the light emitting layers 23R(1), 23G, 23R(2), and 23B are formed in different colors in the TFT substrate 10 as the vapor-deposited film patterns on the film formation substrate 200, the openings 102a are formed in correspondence with a size and a pitch of columns for each color of the light emitting layers 23R(1), 23G, 23R(2), or 23B.

For example, in a case where the light emitting layers 23R(1) and 23R(2) of the sub pixels 2 R(1) and 2R(2) which display red are formed, the light emitting layers 23R(1) and 23R(2) are formed by using a fine mask as the mask 102 for vapor-deposition, which fine mask has an opening corresponding to a region to be vapor-deposited by a red light emitting material.

For example, the hole injecting layer also serving as the hole transporting layer 22 (or hole injecting layer or hole transporting layer), the electron transporting layer 24, and the electron injecting layer 25 are examples of a vapor-deposited film pattern formed on the whole display region.

In this case, the hole injecting layer also serving as the hole transporting layer 22 (or hole injecting layer or hole transporting layer), the electron transporting layer 24, and the electron injecting layer 25 are formed by using an open mask as the mask 102 for vapor-deposition, which open mask has an opening corresponding to the whole display region and a region which needs to be vapor-deposited. Note that the same applies to the second electrode 26.

Note, however, that, in a case where an organic film is formed on a whole surface of a surface 200a, on which a film is to be formed, of the film formation substrate 200, the mask 102 is not always needed.

The limiting plate 300 has a plurality of openings 301 (through holes) which penetrate the limiting plate in a vertical direction.

The vapor-deposition particles emitted from the injection port 103a of the vapor-deposition source 103 reach the film formation substrate 200 through the openings 301 of the limiting plate 300 and the openings 102a of the mask 102.

The vapor-deposition particles emitted from the injection port 103a of the vapor-deposition source 103 are radially emitted, i.e., are emitted while emitted to a certain extent.

However, the vapor-deposition particles, emitted the injection port 103a of the vapor-deposition source 103, pass through the openings 301 of the limiting plate 300, so that an angle of the vapor-deposition particles entering the film formation substrate 200 is limited to a certain or less degree.

That is, in a case where scanning vapor-deposition is carried out with use of the limiting plate 300, a vapor-deposition particle(s) having an emission angle larger than the spread angle of the vapor-deposition particles by the limiting plate 300 is/are blocked by the limiting plate 300.

Note that the limiting plate 300 is not heated or is cooled by a heat exchanger (not shown) so as to block an obliquely injected vapor deposition particle component. Therefore, the limiting plate 300 is lower in temperature than the injection ports 103a of the vapor-deposition source 103.

In order to prevent vapor-deposition particles from flying in a direction of the film formation substrate 200, it is necessary to locate a shutter (not shown) between the limiting plate 300 and the vapor-deposition source 103.

Therefore, a location of the limiting plate 300 in a direction vertical to the film formation surface 200a of the film formation substrate 200 is not particularly limited provided that the limiting plate 300 is provided between the mask 102 and the vapor-deposition source 103 while having a space with respect to the vapor-deposition source 103. For example, the limiting plate 300 may be provided while adhering to the mask 102.

A length of a long side of the limiting plate 300 is formed to be as substantially large as that of the mask 102, meanwhile, a length of a short side of the limiting plate 300 is formed to be as substantially large as that of the mask 102, for example.

Note that FIG. 6 illustrates an example where the limiting plate 300 is provided between the mask 102 and the vapor-deposition source 103 as described above, however, the limiting plate 300 is not always needed.

Further, FIG. 6 illustrates an example where the vapor-deposition source 103 emits vapor-deposition particles upward so as to vapor-deposit (up vapor-deposit) the vapor-deposition particles to the film formation substrate 200 under the state in which the vapor-deposition source 103 is placed below the film formation substrate 200 and the film formation surface 200a of the film formation substrate 200 is directed downward.

However, the way to vapor-deposit vapor-deposition particles is not limited thereto, and the following arrangement may be employed: the vapor-deposition source 103 emits vapor-deposition particles downward so as to vapor-deposit (down vapor-deposit) the vapor-deposition particles to the film formation substrate 200 under the state in which the vapor-deposition source 103 is provided above the film formation substrate 200.

Alternatively, the following another arrangement may also be employed: the vapor-deposition source 103 emits the vapor-deposition particles in the lateral direction so as to vapor-deposit (side vapor-deposit) the vapor-deposition particles to the film formation substrate 200 under the state in which the vapor-deposition source 103 has, for example, a mechanism for emitting vapor-deposition particles in a lateral direction and the film formation surface 200a of the film formation substrate 200 is directed to the vapor-deposition source 103 in the vertical direction.

<Method of Producing Organic EL Display Device 1>

Figure 7:
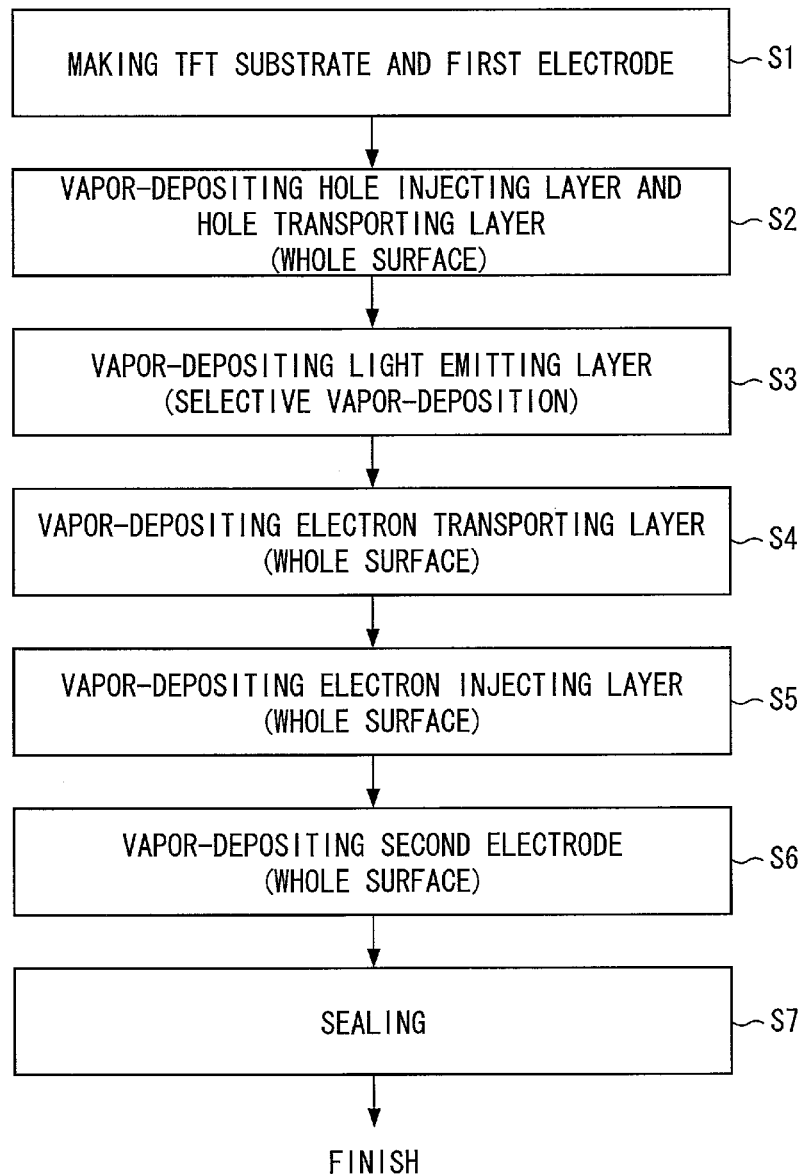
FIG. 7 is a flowchart showing steps of producing the organic EL display device in accordance with Embodiment 1 of the present invention in the order of steps.

FIG. 7 is a flowchart showing steps of producing the organic EL display device 1 in the order of steps.

As shown in FIG. 7, the method of producing the organic EL display device 1 of Embodiment 1 includes, for example, a TFT substrate and first electrode forming step (S1), a hole injecting layer and hole transporting layer vapor-deposition step (S2), a light emitting layer vapor-deposition step (S3), an electron transporting layer vapor-deposition step (S4), an electron injection layer vapor-deposition step (S5), a second electrode vapor-deposition step (S6), and a sealing step (S7).

The following description will discuss the above steps according to the flowchart shown in FIG. 7, with reference to FIGS. 2 and 3.

Note that a size, material, shape, etc. of each member described in Embodiment 1 are merely one example, and the scope of the present invention is not limited thereto.

As described above, the stacking order of layers in Embodiment 1 is for the configuration that a first electrode 21 serves as the anode and a second electrode 26 serves as the cathode. Conversely, for the configuration that the first electrode 21 serves as the cathode and the second electrode 26 serves as the anode, the stacking order of the organic electroluminescence layers is inverted. Similarly, in such the case, the material of the first electrode 21 and the material of the second electrode 26 are replaced with each other.

First, as shown in FIG. 3, a photosensitive resin is applied onto the insulating substrate 11 such as glass on which the TFT 12, the wire 14, etc. are formed by a publicly-known technique, and the photosensitive resin is subjected to patterning by photolithography, so that the interlayer insulating film 13 is formed on the insulating substrate 11.

Used as the insulating substrate 11 is, for example, a glass or plastic substrate having a thickness of 0.7 mm to 1.1 mm, a length in a y-axis direction (vertical length) of 400 mm to 500 mm, and a length in an x-axis direction (horizontal length) of 300 mm to 400 mm. In Embodiment 1, the glass substrate is used as the insulating substrate 11.

The interlayer insulating film 13 can be made of, for example, acrylic resin, polyimide resin, or the like. Examples of the acrylic resin encompass an OPTOMER series (available from JSR Corporation). Examples of the polyimide resin encompass a Photoneece series (available from Toray). Typically, the polyimide resin is not transparent but is colored. Therefore, in order to produce, as shown in FIG. 3, a bottom-emitting organic EL display device as the organic EL display device 1, the interlayer insulating film 13 is preferably made from transparent resin such as the acrylic resin.

A film thickness of the interlayer insulating film 13 is not particularly limited, provided that the interlayer insulating film 13 can compensate for a difference in level caused by the TFT 12. In Embodiment 1, the film thickness of the interlayer insulating film 13 is approximately 2 μm.

Then, a contact hole 13a, through which the first electrode 21 is electrically connected to the TFT 12, is formed in the interlayer insulating film 13.

Then, as a conductive film (electrode film), an ITO (Indium Tin Oxide) film, for example, is formed by sputtering or the like so that the ITO film has a thickness of 100 nm.

Subsequently, a photoresist is applied onto the ITO film, and is then subjected to patterning by photolithography. After that, the ITO film is etched by using ferric chloride as an etchant. Then, the photoresist is removed by a resist remover, and the substrate is washed. As a result, the first electrodes 21 are arranged on the interlayer insulating film 13 in matrix.

Examples of a conductive film material from which the first electrodes 21 are made encompass: transparent conductive materials such as ITO, IZO (Indium Zinc Oxide), and gallium doped zinc oxide (GZO); and metal materials such as gold (Au), nickel (Ni), and platinum (Pt).

Instead of the sputtering, the conductive film can be formed by a vacuum evaporation method, a CVD (chemical vapor deposition) method, a plasma CVD method, or a printing method, for example.

A thickness of each of the first electrodes 21 is not particularly limited. For example, as described above, the thickness of the first electrode 21 can be 100 nm.

Next, in a similar manner to that for the interlayer insulating film 13, the edge cover 15 is formed by patterning so that the edge cover 15 has a film thickness of approximately 1 μm. The edge cover 15 can be made from an insulating material similar to that of the interlayer insulating film 13.

As a result of the above procedure, the TFT substrate 10 and the first electrode 21 are formed (S1).

Next, the TFT substrate 10 having been subjected to the above process is baked under a reduced pressure for desiccation, and is subjected to an oxygen plasma treatment for washing a surface of the first electrode 21.

Subsequently, by using a conventional vapor-deposition device, a hole injecting layer and a hole transporting layer (the hole injecting layer also serving as the hole transporting layer 22 in Embodiment 1) are vapor-deposited on the TFT substrate 10, specifically, on the whole display region of the TFT substrate 10 (S2).

More specifically, an open mask having an opening corresponding to the whole display region is joined firmly to the TFT substrate 10 after an alignment adjustment is carried out on the TFT substrate 10. Then, while the TFT substrate 10 and the open mask are being rotated, vapor-deposition particles scattered from the vapor-deposition source are uniformly vapor-deposited on the whole display region through the opening of the open mask.

The vapor-deposition on the whole display region means that vapor-deposition is continuously carried out on adjacent sub pixels of different colors.

As described above, the hole injecting layer and the hole transporting layer may be integrally formed, or may be independently formed. A film thickness of each of the hole injecting layer and the hole transporting layer is, for example, 10 nm to 100 nm.

Examples of a material of the hole injecting layer and the hole transporting layer, or the hole injecting layer also serving as the hole transporting layer 22 encompass (i) anthracene, azatriphenylene, fluorenone, hydrazone, stilbene, triphenylene, benzine, styryl amine, triphenylamine, porphyrin, triazole, imidazole, oxadiazole, oxazole, polyarylalkane, phenylenediamine, arylamine, and a derivative of any of the above, and (ii) a monomer, an oligomer, and a polymer of an open chain conjugated system and cyclic conjugated system, such as a thiophene compound, a polysilane compound, a vinylcarbazole compound, and an aniline compound.

In Embodiment 1, as the hole injecting layer and the hole transporting layer, the hole injecting layer also serving as the hole transporting layer 22 is provided. Further, the hole injecting layer also serving as the hole transporting layer 22 is made from 4,4'-bis[N-(1-naphthyl)-N-phenylamino]biphenyl ($\alpha$-NPD). Further, in Embodiment 1, a film thickness of the hole injecting layer also serving as the hole transporting layer 22 is 30 nm.

Next, the light emitting layers 23R(1), 23G, 23R(2), and 23B are formed on the hole injecting layer also serving as the hole transporting layer 22 by forming the sub pixels 2R(1), 2G, 2R(2), and 2B in different colors (pattern forming) so as to cover the exposed sections 15R(1), 15G, 15R(2), and 15B in the edge cover 15 (S3), respectively.

As described above, the light emitting layers 23R(1), 23G, 23R(2), and 23B are each made from a material having high current efficiency such as a low-molecular fluorescent dye or a metal complex. Examples of such the material encompass (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and a derivative of any of the above, (ii) a tris(8-hydroxyquinolinate) aluminum complex, (iii) a bis(benzohydroxyquinolinate) beryllium complex, (iv) a tri(dibenzoylmethyl) phenanthroline europium complex, and (v) ditoluoyl vinyl biphenyl.

A film thickness of each of the light emitting layers 23R(1), 23G, 23R(2), and 23B is, for example, 10 nm to 100 nm.

Detailed description will be discussed later as to (i) the vapor-deposition method of Embodiment 1 and (ii) the formation of the light emitting layers 23R(1), 23G, 23R(2), and 23B by selective forming with use of the vapor-deposition device of Embodiment 1.

Next, in a similar manner to that in the above hole injecting layer and hole transporting layer vapor-deposition step (S2), the electron transporting layer 24 is vapor-deposited on the whole display region of the TFT substrate 10 so as to cover the hole injecting layer also serving as the hole transporting layer 22 and the light emitting layers 23R(1), 23G, 23R(2), and 23B (S4).

Subsequently, in a similar manner to that in the above hole injecting layer and hole transporting layer vapor-deposition step (S2), the electron injecting layer 25 is vapor-deposited on the whole display region of the TFT substrate 10 so as to cover the electron transporting layer 24 (S5).

Examples of materials of the electron transporting layer 24 and the electron injecting layer 25 encompass tris(8-quinolinolato) aluminium complex, oxadiazole derivative, triazole derivative, phenylquinoxaline derivative, and silole derivative.

Specific examples of such the material encompass (i) Alq (tris(8-hydroxyquinoline)aluminium), anthracene, naphthalene, phenanthrene, pyrene, anthracene, perylene, butadiene, coumarin, acridine, stilbene, 1,10-phenanthroline, derivatives thereof, metal complexes thereof, and (ii) LiF.

As described above, the electron transporting layer 24 and the electron injecting layer 25 may be integrally formed, or may be independently formed. A film thickness of each of the electron transporting layer 24 and the electron injecting layer 25 is, for example, 1 nm to 100 nm. A total film thickness of the electron transporting layer 24 and the electron injecting layer 25 is, for example, 20 nm to 200 nm.

In Embodiment 1, the material of the electron transporting layer 24 is Alq, and the material of the electron injecting layer 25 is LiF. Further, in Embodiment 1, the film thickness of the electron transporting layer 24 is 30 nm, and the film thickness of the electron injecting layer 25 is 1 nm.

Next, in a similar manner to that in the above hole injecting layer and hole transporting layer vapor-deposition step (S2), the second electrode 26 is vapor-deposited on the whole display region of the TFT substrate 10 so as to cover the electron injecting layer 25 (S6).

A suitable material (electrode material) of the second electrode 26 is, for example, a metal having a small work function. Examples of such the electrode material encompass a magnesium alloy (e.g., MgAg), an aluminum alloy (e.g., AlLi, AlCa, and AlMg), and metallic calcium. A thickness of the second electrode 26 is, for example, 50 nm to 100 nm.

In Embodiment 1, the second electrode 26 is made from aluminum having a film thickness of 50 nm. As a result, the organic EL element 20 including the above organic electroluminescence layer, first electrode 21, and second electrode 26 is formed on the TFT substrate 10.

Subsequently, the TFT substrate 10 on which the organic EL element 20 is formed is bonded to the sealing substrate 40 by the adhesive layer 30 so that the organic EL element 20 is enclosed.

Used as the sealing substrate 40 is, for example, an insulating substrate made of a glass or plastic substrate having a thickness of 0.4 mm to 1.1 mm. In Embodiment 1, the glass substrate is used as the sealing substrate 40.

Note that vertical and horizontal lengths of the sealing substrate 40 may be appropriately adjusted in accordance with the size of the target organic EL display device 1. An insulating substrate, which is substantially as large as the insulating substrate 11 in the TFT substrate 10, can be used, and the insulating substrate can be cut in accordance with the size of the target organic EL display device 1 after the organic EL element 20 has been enclosed.

Note that the method of enclosing the organic EL element 20 is not limited to the above method. Examples of other enclosing methods encompass: a method that involves the use of caved glass as the sealing substrate 40 and that encloses the organic EL element 20 in a frame-like manner with sealing resin, glass frit, or the like; and a method of filling a space between the TFT substrate 10 and the sealing substrate 40 with resin. The method of producing the organic EL display device 1 does not rely on the above enclosing methods, and any enclosing method can be applied.

Further, a protective film (not shown) may be provided on the second electrode 26 so as to cover the second electrode 26, for the purpose of preventing oxygen and/or water from entering the organic EL element 20 from the outside.

The protective film is made from an insulating or conductive material. Examples of such the material encompass silicon nitride and oxide silicon. A thickness of the protective film is, for example, 100 nm to 1000 nm.

As a result of the above procedures, the organic EL display device 1 is completed.

In the organic EL display device 1, turning on the TFT 12 by a signal supplied from the wire 14 (i.e., turning on Tr2 after the transistor Tr1 is turned on and a voltage at the capacitor C is determined) allows holes to be injected from the first electrode 21 into the organic electroluminescence layer. Meanwhile, electrons are injected from the second electrode 26 into the organic electroluminescence layer. As a result, the holes and the electrons are recombined with each other in the light emitting layers 23R(1), 23G, 23R(2), and 23B. At the moment that energy of the holes and the electrons recombined with each other is deactivated, light is emitted.

By controlling luminance of each of the sub pixels 2R(1), 2G, 2R(2), and 2B, a predetermined image is displayed on the organic EL display device 1.

<Method of Selective Forming of Light Emitting Layers>

The following description will discuss in detail the method of forming the light emitting layers 23R(1), 23G, 23R(2), and 23B by selective forming with use of the vapor-deposition device 150.

Figure 8:
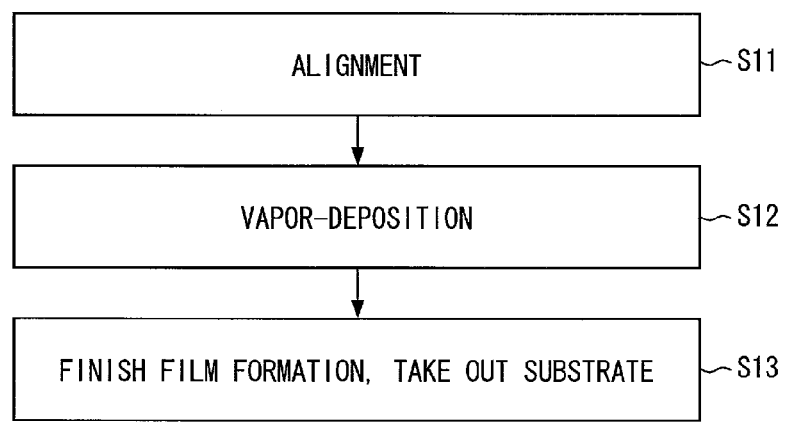
FIG. 8 is a flowchart showing an example method of forming a film having a predetermined pattern on a TFT substrate with use of a vapor-deposition device of FIG. 7.

FIG. 8 is a flowchart showing an example method of forming a film having a predetermined pattern on the film formation substrate 200, which serves as the TFT substrate 10, with use of the vapor-deposition device 150 of FIG. 7.

First, as shown in FIG. 6, the vapor-deposition source 103, the mask 102 (fine mask), the limiting plate 300, and the film formation substrate 200 are put into the vacuum chamber 600, and then the vapor-deposition source 103, the mask 102, the limiting plate 300, and the film formation substrate 200 are aligned with each other (S11).

Note that the alignment may be carried out by any of conventional means and methods such as those involving use of a holder (e.g., a mask holder) or an alignment marker, and the order of aligning the members is not particularly limited.

The mask 102 and the limiting plate 300 are set (fixed) above the vapor-deposition source 103 in such a manner that the limiting plate 300 is located between the vapor-deposition source 103 and the mask 102.

The mask 102, the limiting plate 300, and the vapor-deposition source 103 are dealt as, e.g., the mask unit 500 in order that a relative positional relationship therebetween is fixed.

The mask unit 500 and the film formation substrate 200 are respectively held by a member (not shown) for holding a mask unit and a member (not shown) for holding a substrate on which a film is to be formed, for example.

In the alignment, the positions of the vapor-deposition source 103 and the mask 102 are adjusted so that (i) a distance between the vapor-deposition source 103 and the mask 102 is kept constant and (ii) a substrate scanning direction coincides with a direction along longer axes of the openings 102a, which are provided in the striped mask 102.

Further, the position of the film formation substrate 200 is adjusted so that the direction of each line of sub pixels of the identical color on the film formation substrate 200 coincides with the substrate scanning direction. Furthermore, a gap is adjusted so that a gap (i.e., substrate—mask gap) between the film formation substrate 200 and the mask 102 is made constant.

Next, while scanning of at least one of the film formation substrate 200 and the mask unit 500 is being carried out, a material of the blue light emitting layer 23B, for example, is vapor-deposited on the TFT substrate 10 serving as the film formation substrate 200 (S12).

During this, the substrate is scanned so that the film formation substrate 200 moves over the mask 102.

The light emitting layer 23B is made from 3-phenyl-4(1'-naphthyl)-5-phenyl-1,2,4-triazole (TAZ) (host material) and 2-(4'-t-butylphenyl)-5-(4''-biphenylyl)-1,3,4-oxadiazole (t-Bu PBD) (blue light-emitting dopant). The light emitting layer 23B is produced by concurrent vapor-deposition of these materials (blue organic materials) at a speed of 5.0 nm/s (for the host material) and a speed of 0.67 nm/s (for the blue light-emitting dopant).

While the film formation substrate 200 is moving over the mask 102, vapor-deposition particles of the blue organic materials emitted by the vapor-deposition source 103 are vapor-deposited, through the openings 102a of the mask 102, on parts of the film formation substrate 200, the parts respectively facing the openings 102a of the mask 102.

Consequently, a vapor-deposited film having a stripe pattern is formed from one end of the film formation substrate 200 to the other end of the substrate 20 along the direction in which the film formation substrate 200 has been moved.

In this case, used as the mask 102 is a fine mask having openings 102a corresponding to a vapor-deposited film pattern which is to be formed on the film formation substrate 200. That is, in this case, used as the mask 102 is the fine mask having the openings 102a located so as to correspond to the light emitting layer 23B.

It is possible to adjust a film thickness of the light emitting layer by changing the number of scanning carried out reciprocatively (i.e., reciprocated movements of the film formation substrate 200) and the scanning speed.

In Embodiment 1, after the film formation substrate 200 is scanned in one direction as shown in FIG. 6, the direction in which the film formation substrate 200 is scanned is reversed. That is, by a similar manner to that in the precedent vapor-deposition carried out by the scanning in the one direction, the blue organic materials are further vapor-deposited on the vapor-deposited film made from the blue organic material that has been vapor-deposited in the precedent vapor-deposition carried out by the scanning in the one direction. Consequently, the light emitting layer 23B having a film thickness of 50 nm is formed.

After that, the film formation substrate 200 on which the light emitting layer 23B is formed is taken out from the vacuum chamber 600 (S13).

Next, the red light emitting layers 23R(1) and 23R(2) are formed in a similar manner to that in the above film forming process for the light emitting layer 23B, the red light emitting layers 23R(1) and 23R(2) being formed by use of the mask unit 500 and the vacuum chamber 600 each for forming the red light emitting layers 23R(1) and 23R(2), on the film formation substrate 200 on which the light emitting layer 23B is formed.

In the film forming process for the light emitting layers 23R(1) and 23R(2), prepared as the mask 102 is a fine mask having openings 102a located so as to correspond to the light emitting layers 23R(1) and 23R(2).

Then, the mask 102 is set in the vacuum chamber 600 for forming the light emitting layers 23R(1) and 23R(2), and alignment is carried out so that the openings 102a of the mask 102 are aligned with the respective lines of sub pixels 2R(1) and 2R(2). Thereafter, vapor-deposition is carried out.

The light emitting layers 23R(1) and 23R(2) are made from TAZ (host material) and bis(2-(2'-benzo[4,5-α]thienyl)pyridinato-N,C3')iridium(acetylacetonato(btp2Ir(acac)) (red light-emitting dopant). The light emitting layers 23R(1) and 23R(2) are produced by concurrent vapor-deposition of these materials (red organic materials) at a speed of 5.0 nm/s (for the host material) and a speed of 0.53 nm/s (for the red light-emitting dopant).

A film thickness of each of the light emitting layers 23R(1) and 23R(2) is 50 nm.

After that, the film formation substrate 200 on which the light emitting layers 23R(1) and 23R(2) are formed is taken out from the vacuum chamber 600.

After the light emitting layers 23R(1) and 23R(2) are formed as described above, the green light emitting layer 23G is formed in a similar manner to that in the film forming process for the light emitting layers 23B, 23R(1), and 23R(2), with use of a mask unit 500 and a vacuum chamber 600 each for forming the green light emitting layer 23G.

In the film forming process for the light emitting layer 23G, prepared as the mask 102 is a fine mask having openings 102a located so as to correspond to the light emitting layer 23G.

Then, the mask 102 is set in the vacuum chambers 600 for forming the light emitting layer 23G, and the openings 102a of the mask 102 are aligned with the respective lines of sub pixels 2G. Thereafter, vapor-deposition is carried out.

The light emitting layer 23G is made from TAZ (host material) and Ir(ppy)3 (green light-emitting dopant). The light emitting layer 23G is produced by concurrent vapor-deposition of these materials (green organic materials) at a speed of 5.0 nm/s (for the host material) and a speed of 0.67 nm/s (for the green light-emitting dopant).

A film thickness of the light emitting layer 23G is 50 nm.

As a result of the above processes, the TFT substrate 10 on which the light emitting layers 2R(1), 2G, 2R(2), and 2B are subjected to patterning is obtained.

<Relationship Between Array of Sub Pixels and Color Mixture>

The following description will discuss effects given by the array of the sub pixels in the organic EL display device 1 of Embodiment 1 in view of a relationship between (i) misplacement of the vapor-deposited film light emitting layer patterns 2R(1), 2G, 2R(2), and 2B on the TFT substrate 10 and (ii) the color mixture.

As shown in FIGS. 1 through 3, one of the lines of red (R) sub pixels is necessarily provided between a corresponding one of the lines of green (G) sub pixels and a corresponding one of the lines of blue (B) sub pixels in the organic EL display device 1.

The reason for this is as follows.

As described above, the sub pixels of the respective colors have different current efficiencies. The order of descending current efficiencies is generally G, R, and B (i.e., G has a highest current efficiency).

In a case where the vapor-deposited film patterns selectively formed for the sub pixels of G, R, and B, particularly, the light emitting layer patterns 23R(1), 23G, 23R(2), and 23B are displaced as described above and the misplacement falls outside a tolerance, a light emitting layer that should be formed within one of two adjacent sub pixels (hereinafter, such sub pixels are described as "sub pixels (P1) and (P2)" for convenience of explanation) intrudes into a light emitting region of the other one (sub pixel (P2)).

In a case where a light emitting layer in the light emitting region of the sub pixel (P2), into which the sub pixel (P1) intrudes, has a color different from that of a light emitting layer of the sub pixel (P1) which intrudes into the sub pixel (2), the light emitting region of the sub pixel (P2) is affected by the color of the light emitting layer of the sub pixel (P1). That is, there occurs so-called color mixture, which means mixture of the colors of the adjacent sub pixels (P1) and (P2).

An effect of the color mixture varies depending on a difference in current efficiency between light emitting layers that causes color mixture.

Here, assuming that (i) a current efficiency of the light emitting layer of the sub pixel (P2), into which the sub pixel (1) intrudes, is a relatively lower than (ii) a current efficiency of the light emitting layer of the sub pixel (P 1), which intrudes into the sub pixel (P2).

Then, in a case where the light emitting layer of the sub pixel (P1) intrudes into the light emitting region of the sub pixel (P2) so as to be overlapped therewith due to the misplacement of the light emitting layers, a level of light (intensity of light) emitted therefrom becomes greater even if the intrusion is very small.

That is, the greater the difference in current efficiency between the light emitting layers of the respective colors is, the greater the effect of the color mixture becomes.

<Relationship Between Difference in Current Efficiency and Effect of Color Mixture>

The following description will discuss, with mathematical formulae, a relationship between the difference in current efficiency and the effect of the color mixture.

Here, "k" denotes a ratio of a part of the light emitting layer of the sub pixel (P1), which part intrudes into the sub pixel (P2). Note that "k" is equal to a ratio of (i) an area of a region (overlapping region) of the light emitting layer of the sub pixel (P2) in which region the light emitting layer of the sub pixel (P2) is overlapped with the light emitting region of the sub pixel (P1) to (ii) an area of the light emitting region of the sub pixel (P2).

Further, "N" denotes a variable by which an electric resistance is multiplied as a result of an increase in a total film thickness of the light emitting layers of the sub pixels (P1) and (P2) due to the overlapping of these light emitting layers in the sub pixel (P2).

Here, assuming that the light emitting layer of the sub pixel (P2) has an electric resistance of "Rx" at a certain electric current value when no color mixture (no intrusion) occurs. Then, a total resistance of the light emitting layer of the sub pixel (P2) when the color mixture occurs can be considered as a parallel circuit of a resistance having a resistance value "Rx/(1−k)" and a resistance having a resistance value "N×Rx/k".

In a case where the organic EL element 20 is driven at a constant current density "i", a current density "is" in the overlapping region and a current density "im" in the non-overlapping are expressed by Formula 1 and Formula 2.

$$is = \frac{k}{k+(1-k)N} \cdot i \quad \text{Formula 1}$$

$$im = \frac{(1-k)N}{k+(1-k)N} \cdot i \quad \text{Formula 2}$$

These formulae are expressed as "is=1/46×i" and "im=45/46×i", where k=0.1 and N=5. That is, an electric current is divided into the overlapping region and the non-overlapping region according to this ratio.

Next, ξ denotes a ratio of an electric current contributing to light emission from the light emitting region of the sub pixel (P2) with respect to an electric current flown to the overlapping region.

That is, an electric current corresponding to the ratio ξ is converted into output light having the color of the sub pixel (P2) that should originally be emitted.

However, an electric current corresponding to the ratio (1−ξ) is converted into output light having the color of the sub pixel (P1) adjacent the sub pixel (P2).

Thus, a luminance E of emitted light having the color of the sub pixel (P2) is expressed by Formula 3, and a luminance Ex of emitted light having the color of the sub pixel (P1) which intrudes into the sub pixel (P2) and is adjacent to the sub pixel (P2) is expressed by Formula 4, where "η" denotes the current efficiency of the light emitting layer of the sub pixel (P2), and "ηx" denotes the current efficiency of the light emitting layer of the sub pixel (P1).

$$E = \eta \cdot \frac{(1-k)N + \xi k}{k+(1-k)N} \cdot i \quad \text{Formula 3}$$

$$Ex = \eta x \cdot \frac{(1-\xi)k}{k+(1-k)N} \cdot i \quad \text{Formula 4}$$

These formulae are expressed as "E=91/92×η×i" and "Ex=1/92×η×x×i", where ξ=0.5 and the above values of "k" and "N" are used.

Here, assuming that the light emitting layer of the sub pixel (P1) does not intrude into the sub pixel (P2), these formulae are expressed as "E=η×i" and "Ex=0". Thus, in the sub pixel (P2), the luminance of light that should originally be emitted by the sub pixel (P2) is reduced to 91/92, and light having the color of the sub pixel (P1) is mixed and appeared in an amount corresponding to "1/92×η×x×i".

As is clear from Formula 4, the greater the values of "ηx" and "i" are, the greater the effect of the color mixture (i.e., the value of "Ex") becomes. A maximum "ηx" becomes largest in a case where a light emitting layer has a highest current efficiency, whereas "i" becomes larger in a case where the light emitting layer has a lowest current efficiency. That is, the effect of the color mixture is the greatest in a case where a light emitting layer having a highest current efficiency intrudes into a light emitting region of a sub pixel in which a light emitting layer having a lowest current efficiency is formed.

Note that, in Embodiments 1 and 2, the term "current efficiency" means a corresponding one of current efficiencies observed in a case where the light emitting layers of the light emitting regions of respective colors emit light having an identical luminance, unless otherwise particularly mentioned.

In such a configuration that one pixel is constituted by sub pixels of three colors (G, R, and B) as in Embodiment 1, the sub pixel G has a significantly higher current efficiency (cd/A) than the sub pixel B. That is, the sub pixel G emits light having a significantly large luminance per unit electric current.

That is, in a case where the identical electric current value is flown to the sub pixel G and the sub pixel B, the sub pixel G emits light having a greater luminance (emits brighter) than the sub pixel B.

Thus, in a case where a light emitting layer of the sub pixel G intrudes into a light emitting region of the sub pixel B, the sub pixel G is greater in light intensity than the sub pixel B even if an area of a region where color mixture occurs is small. Therefore, a color greatly different from a color of the sub pixel B is outputted from a region where the color mixture occurs. As a result, the color mixture clearly appears.

Occurrence of such the color mixture leads to reduction in display quality of the organic EL display device.

In order to avoid this, Embodiment 1 is configured such that, as shown in FIGS. 1 through 3, the sub pixel 2R(2) is disposed between the sub pixel 2G and the sub pixel 2B which have been located to be adjacent to each other in the conventional arrangement. Further, in Embodiment 1, each pixel 2 is configured such that the sub pixels of the respective colors are arrayed in a one-dimensional direction in the order of the sub pixel 2R(1), the sub pixel 2G, the sub pixel 2R(2), and the sub pixel 2B.

That is, according to Embodiment 1, the sub pixels of red (R), green (G), red (R), and blue (B) are arrayed in a row direction in this order.

According to Embodiment 1, by arraying the sub pixels of the respective colors as described above, it is possible to prevent reduction in display quality caused by misplacement of light emitting layers, as compared with the conventional arrangement, even if a light emitting layer of one (sub pixel (P1)) of two adjacent sub pixels (P1) and (P2) intrudes into a light emitting region of the other one (sub pixel (P2)).

<Behavior of Light in Each Sub Pixel Observed when Vapor-deposited Patterns are Displaced>

The following description will specifically discuss of behavior of light in each of the sub pixels 2R(1), 2G, 2R(2), and 2B observed in a case where vapor-deposited patterns are displaced in the above array of the sub pixels 2R(1), 2G, 2R(2), and 2B.

(a) through (h) of FIG. 9 are schematic views each showing, with use of an arrangement of a main part of the TFT substrate 10, an example where a light emitting layer of one of two adjacent ones of the sub pixels 2R(1), 2G, 2R(2), and 2B in the pixel 2 in the organic EL display device 1 intrudes into a light emitting region of the other one of the sub pixels.

Assumed here is such a situation that, as shown in each of (a) through (h) of FIG. 9, the light emitting layers of the respective colors are displaced and one of the light emitting layers of two adjacent sub pixels intrudes into a light emitting region of the other one.

In such the situation, the following eight intrusion patterns (patterns (1) through (8)) shown in (a) through (h) of FIG. 9 are assumed.

Pattern (1): as shown in (a) of FIG. 9, after formation of the light emitting layer 23R(1) of the sub pixel 2R(1), the light emitting layer 23G of the sub pixel 2G intrudes into the light emitting region provided in a region where the exposed section 15R(1) of the sub pixel 2R(1) is formed.

Pattern (2): as shown in (b) of FIG. 9, prior to formation of the light emitting layer 23R(1) of the sub pixel 2R(1), the light emitting layer 23G of the sub pixel 2G intrudes into the light emitting region provided in a region where the exposed section 15R(1) of the sub pixel 2R(1) is formed.

Pattern (3): as shown in (c) of FIG. 9, prior to formation of the light emitting layer 23G of the sub pixel 2G, the light emitting layer 23R(1) of sub pixel 2R(1) intrudes into the light emitting region in a region where the exposed section 15G of the sub pixel 2G is formed.

Pattern (4): as shown in (d) of FIG. 9, after formation of the light emitting layer 23B of the sub pixel 2B, the light emitting layer 23R(2) of the sub pixel 2R(2) intrudes into the light emitting region in a region where the exposed section 15G of the sub pixel 2G is formed.

Pattern (5): as shown in (e) of FIG. 9, after formation of the light emitting layer 23B of the sub pixel 2B, the light emitting layer 23R(2) of the sub pixel 2R(2) intrudes into the light emitting region in a region where the exposed section 15B of the sub pixel 2B is formed.

Pattern (6): as shown in (f) of FIG. 9, prior to formation of the light emitting layer 23G of the sub pixel 2G, the light emitting layer 23R(2) of the sub pixel 2R(2) intrudes into the light emitting region in a region where the exposed section 15B of the sub pixel 2B is formed.

Pattern (7): as shown in (g) of FIG. 9, prior to formation of the light emitting layer 23R(2) of the sub pixel 2R(2), the light emitting layer 23B of the sub pixel 2B intrudes into the light emitting region in a region where the exposed section 15R(1) of the sub pixel 2R(2) is formed.

Pattern (8): as shown in (h) of FIG. 9, after formation of the light emitting layer 23R(2) of the sub pixel 2R(2), the light emitting layer 23B of the sub pixel 2B intrudes into the light emitting region in a region where the exposed section 15R(2) of the sub pixel 2R(2) is formed.

In the case of the pattern (1) shown in (a) of FIG. 9, there occurs such color mixture that R-colored light (R light) is mixed with G-colored light (G light) in the light emitting region of the sub pixel 2R(1).

However, a difference in current efficiency between the light emitting layer 23R(1) and the light emitting layer 23G is smaller than that between the light emitting layer 23B and the light emitting layer 23G. In other words, in a case where the light emitting layer 23R(1) and the light emitting layer 23B generate light having an identical luminance, the light emitting layer 23R(1) requires a smaller amount of electric current than the light emitting layer 23B since the light emitting layer 23R(1) has a higher current efficiency than the light emitting layer 23B.

The lower the electric current is, the lower the luminance of the G light becomes. For this reason, the effect of the color mixture is smaller in the pattern (1) than in a case where the light emitting layer 23G of the sub pixel 2G intrudes into the light emitting region of the sub pixel 2B.

The same as in the pattern (1) applies to the pattern (2) shown in (b) of FIG. 9.

In the case of the pattern (3) shown in (c) of FIG. 9, there occurs such color mixture that G light is mixed with R light in the light emitting region of the sub pixel 2G.

However, a difference in current efficiency between the light emitting layer 23R(1) and the light emitting layer 23G is smaller than that between the light emitting layer 23B and the light emitting layer 23G. In other words, in a case where the light emitting layer 23R(1) and the light emitting layer 23B generate light of an identical luminance, the light emitting layer 2R(1) requires a smaller amount of electric current than the light emitting layer 23B since the light emitting layer 2R(1) has a higher current efficiency than the light emitting layer 23B.

For this reason, the effect of the color mixture is greater in a case where the light emitting layer 23R(1) intrudes into the light emitting region of the sub pixel 2G than in a case where the light emitting layer 23B of the sub pixel 2B intrudes into the light emitting region of the sub pixel 2G. However, since the light emitting layer 23G has a highest current efficiency, the amount of electric current required by the light emitting layer 23G is the lowest. The lower the electric current is, the slower the luminance of the R light becomes.

Therefore, even if the light emitting layer 23R(1) of the sub pixel 2R intrudes into the light emitting region of the sub pixel 2G, the effect of the color mixture hardly becomes a critical problem.

The same as in the pattern (3) applies to the pattern (4) shown in (d) of FIG. 9.

In the case of the pattern (5) shown in (e) of FIG. 9, there occurs such color mixture that B-colored light (B light) is mixed with R light in the light emitting region of the sub pixel 2B.

However, a difference in current efficiency between the light emitting layer 23R(2) and the light emitting layer 23B is smaller than that between the light emitting layer 23G and the light emitting layer 23B. In other words, the current efficiency of the light emitting layer 23R(2) is lower than that of the light emitting layer 23G.

For this reason, the effect of the color mixture is smaller in the pattern (4) than in a case where the light emitting layer 23G of the sub pixel 2G intrudes into the light emitting region of the sub pixel 2B.

The same as in the pattern (5) applies to the pattern (6) shown in (f) of FIG. 9.

In the case of the pattern (7) shown in (g) of FIG. 9, there occurs such color mixture that R light is mixed with B light in the light emitting region of the sub pixel 2R(2).

However, a difference in current efficiency between the light emitting layer 23B and the light emitting layer 23R(2) is smaller than that between the light emitting layer 23G and the light emitting layer 23R(2). In other words, the current efficiency of the light emitting layer 23B is lower than that of the light emitting layer 23G.

For this reason, the effect of the color mixture is smaller in the pattern (7) than in a case where the light emitting layer 23G of the sub pixel 2G intrudes into the light emitting region of the sub pixel 2R(2).

The same as in the pattern (7) applies to the pattern (8) shown in (h) of FIG. 9.

In any of the above cases, it is possible to reduce the effect of the color mixture as compared with the pattern where a light emitting layer (light emitting layer 23G) of a color having a highest current efficiency intrudes into a light emitting layer (light emitting layer 23B) of a color having a lowest current efficiency.

The descriptions made so far are summarized as below. (I) the effect of the color mixture is smaller in a case where the light emitting layer of the sub pixel (P1), which intrudes into the sub pixel (P2), has a higher current efficiency than the light emitting layer of the sub pixel (P2), into which the sub pixel (P1) intrudes (current efficiency of light emitting layer of P1>current efficiency of light emitting layer of P2) than in a case where the light emitting layer 23G intrudes into the light emitting region of B.

(II) In a case where the light emitting layer of the sub pixel (P2), into which the sub pixel (P1) intrudes, has a higher current efficiency than the light emitting layer of the sub pixel (P 1), which intrudes into the sub pixel (P2) (current efficiency of light emitting layer of P2>current efficiency of light emitting layer of P1), the luminance of light emitted by the light emitting layer of the sub pixel (P1), which intrudes into the sub pixel (P2), becomes small, since an electric current flown to the sub pixel (P2), into which the sub pixel (P1)

intrudes, may be small. Therefore, the effect of the color mixture hardly becomes a critical problem.

According to Embodiment 1, as described above, in a case where light emitting layers of respective plural colors generate light having an identical luminance, a light emitting layer of a color having an intermediate current efficiency is necessarily provided between a light emitting layer of a color having a highest current efficiency and a light emitting layer of a color having a lowest current efficiency, which intermediate current efficiency is less than the highest current efficiency but more than the lowest current efficiency.

This prevents occurrence of color mixture of (i) a color of light emitted by the light emitting layer of the color having the highest current efficiency and (ii) a color of light emitted by the light emitting layer of the color having the lowest current efficiency.

Thus, by arraying the sub pixels as described above, even if color mixture occurs due to misplacement of the light emitting layers in the finally-obtained organic EL display device 1, the effect of the color mixture can be reduced, as compared with the case where there occurs color mixture of (i) a color of light emitted by the light emitting layer of the color having the highest current efficiency and (ii) a color of light emitted by the light emitting layer of the color having the lowest current efficiency.

For example, as compared with a case where there occurs color mixture of G light and B light in a conventional array including a sub pixel G and a sub pixel B being adjacent to each other, Embodiment 1 of the present invention can reduce the effect of the color mixture, thereby preventing reduction in display quality.

Thus, according to Embodiment 1, it is possible to reduce the effect of the above color mixture without increasing non-light emitting regions between the sub pixels. As a result, it is possible to improve reliability and display quality of the organic EL display device 1.

<Modification Example of Array of Sub Pixels>

As described above, Embodiment 1 has described a case where (i) a minimum constituent pixel unit needed for performing color display is made up of sub pixels of three primary colors, R, G, and B and (ii) the sub pixels of the respective colors in one pixel, i.e., the colors of the light emitted by the light emitting layers of the sub pixel regions in one pixel region in the TFT substrate 10 are arrayed in the order of R, G, R, and B.

However, the arrange of the light colors may be appropriately determined in accordance with the order of current efficiencies, and is not limited to the above arrangement.

FIG. 10 is a schematic view illustrating an example where pixels are arrayed in a one-dimensional direction, i.e., one direction, each of which pixels is constituted by N(N is an integer of three or more) kinds of sub pixels in which vapor-deposited films are different in current efficiency Note that two adjacent ones of the sub pixels are a combination other than a combination of (i) a sub pixel including a light emitting layer (vapor-deposited film) of a color having a highest current efficiency and (ii) a sub pixel including a light emitting layer (vapor-deposited film) of a color having a lowest current efficiency.

In FIG. 10, the sub pixels of the respective colors are numbered from "1" to "N" in the order of descending current efficiencies of the light emitting layers.

In the conventional arrangement, a combination of two adjacent sub pixels is constituted by (i) a sub pixel including a vapor-deposited film having a highest current efficiency and (ii) a sub pixel including a vapor-deposited film having a lowest current efficiency.

Meanwhile, in Embodiment 1, a sub pixel (a sub pixel other than a sub pixel including a light emitting layer of a color having a highest or lowest current efficiency) whose order of current efficiency of the light emitting layer is "K (K=an integer within a range from 2 to (N−1))" is located between (i) a sub pixel (a sub pixel given the reference numeral "1" in FIG. 10) including a light emitting layer of a color having a highest current efficiency and (ii) a sub pixel (a sub pixel given the reference numeral "N" in FIG. 10) including a light emitting layer of a color having a lowest current efficiency. That is, the sub pixels are arrayed in the order of (N−1), (N−2), ..., 2, 1, 2, ..., (N−1), and N, from the left.

As a result, focusing on two sub pixels located to be adjacent to each other, even if a light emitting layer of one of the two sub pixels intrudes into a light emitting region of the other one of the two sub pixels, the above arrangement according to Embodiment 1 can reduce a degree of color mixture caused by the intrusion (a degree of change in color) as compared with the conventional arrangement. Thus, it is possible to prevent reduction in display quality as compared with the conventional arrangement.

As described above, generally, the current efficiency of the light emitting layer of G color is the highest, whereas the current efficiency of the light emitting layer of B color is the lowest.

However, as described above, the light emitting layer is made from a material having a high current efficiency such as a fluorescent dye (e.g., a low-molecular fluorescent dye) or a metal complex. The current efficiency varies by changing materials of a host material and/or a light-emitting dopant and using them in combination as necessary.

Thus, for example, in a case where the order of descending current efficiencies of the light emitting layers is [G], [B], and [R], the array of sub pixels may be constituted by light emitting layers arrayed in the order of [B], [G], [B], and [R].

Note here that the expressions "[R]", "[G]", and "[B]", which are used to describe the order of current efficiencies and the order of array, are abbreviations of the "light emitting layer of R color", the "light emitting layer of G color", and the "light emitting layer of B color", respectively, These expressions are also used in the following description and the later-described Embodiments.

As shown in FIG. 10, the number of colors of sub pixels in one pixel is not limited to three, and may be four or more. In a case where the number of colors in one pixel is four or more, it is only necessary to array the sub pixels so that a difference in current efficiency between light emitting layers of adjacent ones of the sub pixels is the smallest.

Specifically, in arraying the sub pixels, a sub pixel adjacent to another sub pixel may employ a light emitting layer which directly follows or is directly followed by a light emitting layer of the another sub pixel in the order of current efficiencies. Examples of such the case encompass a case where a single pixel is constituted by sub pixels of four colors including the above colors of R, G, and B and an additional color of Y (yellow).

In the following description, a light emitting layer of Y color is abbreviated as [Y], like [R], [G], and [B].

In this case, in a case where the order of descending current efficiencies of light emitting layers of sub pixels of R, G, B, and Y is [G], [Y], [R], and [B] (i.e., current efficiency of light emitting layer of G color>current efficiency of light emitting layer of Y color>current efficiency of light emitting layer of R color>current efficiency of light emitting layer of B color), the sub pixels of the respective colors may be arrayed so as to correspond to the order of light emitting layers [R], [Y], [G], [Y], [R], and [B], and the six sub pixels [R], [Y], [G], [Y], [R], and [B] thus arrayed may be regarded as a minimum constituent unit (one unit) constituting one pixel.

In this case, sub pixels adjacent to the sub pixel of Y color (Y sub pixel) are the sub pixel of R color (R sub pixel) and the sub pixel of G color (G sub pixel), and the R sub pixel and the G sub pixel are adjacent to the Y sub pixel in terms of the order of current efficiencies.

That is, one pixel can be constituted by at least (M−1)×2 sub pixels in order to constitute one pixel by sub pixels of M colors under the conditions that (i) the sub pixels should be arrayed in such a manner that, as described above, the light emitting regions of the light emitting layers of the at respective colors are arranged in a one-dimensional direction and are arrayed so that the light emitting layers of the two adjacent ones of the light emitting regions have a minimum difference in current efficiency.

In this arrangement, each pixel includes a single sub pixel including a light emitting layer having a highest current efficiency, a single sub pixel including a light emitting layer having a lowest current efficiency, and two sub pixels each including a light emitting layer having a current efficiency other than the highest or lowest current efficiency.

<Modification Example of Driving Method>

As described above, Embodiment 1 has described the example where the sub pixel driving circuit including the TFT 12 is provided for each of the sub pixels 2R(1), 2G, 2R(2), and 2B.

However, the present embodiment is not limited to this. That is, the sub pixels 2R(1) and 2R(2) may be individually driven by the TFTs 12 respectively provided for the sub pixels 2R(1) and 2R(2) as described above; alternatively, the two sub pixels 2R(1) and 2R(2) may be driven by a single TFT 12 at the same time.

Individually driving the two sub pixels 2R(1) and 2R(2) as described above doubles definition in a horizontal direction in FIGS. 1 through 3 (i.e., a column direction) only for the R sub pixel.

[Embodiment 2]

The following description will discuss Embodiment 2 with reference mainly to FIGS. 11 through 15.

Note that Embodiment 2 mainly will describe differences between Embodiment 1 and 2. Further, the same reference numerals are denoted to components having similar functions to those of the components described in Embodiment 1, and a description thereof is omitted.

<Outline>

FIG. 11 is a schematic view illustrating an example array of sub pixels in accordance with Embodiment 2. The example array of sub pixels shown in FIG. 11 is such an array that a single pixel 2 is constituted by three sub pixels.

Note that, in FIG. 11, each of sub pixels constituting a single pixel 2 is indicated by solid lines (in FIG. 11, a set of the sub pixels constituting the single pixel 2 is indicated by chain lines), whereas each of sub pixels constituting some of pixels provided in the vicinity of the single pixel 2 is indicated by dashed lines.

Embodiment 2 is different from Embodiment 1 in the array mode of sub pixels constituting one pixel.

Specifically, in the above Embodiment 1, the sub pixels constituting one pixel are arranged in a one-dimensional direction.

On the other hand, in Embodiment 2, the sub pixel of respective colors constituting each pixel 2 (i.e., a single pixel) are arranged in a two-dimensional direction, i.e., two-dimensionally (in a matrix, in tiles-like form), as shown in FIG. 11, for example.

How to array the sub pixels of the respective colors will be described in detail later.

<Vapor-Deposition Method>

The following describes a vapor-deposition method employed for the arrangement in which sub pixels are two-dimensionally arranged as shown in FIG. 11 so as to constitute one pixel.

FIG. 12 is a schematic view illustrating an example vapor-deposition method for use in Embodiment 2.

Differing from the above Embodiment 1, Embodiment 2 employs, as a method of forming vapor-deposited film patterns in the sub pixels, a method of performing vapor-deposition in a state in which a mask 303 for vapor-deposition is fixed onto a substrate 200 on which a film is to be formed (see FIG. 12).

Specifically, the substrate 200 and a vapor-deposition source 302 are located so as to face each other. Further, openings 304 corresponding to a desired pattern of a vapor-deposited film are formed in the mask 303 in order to prevent vapor-deposition particles from adhering to a region which is not a target vapor-deposition region. Then, vapor-deposition particles are vapor-deposited on the substrate 200 through the openings 304. In this way, the pattern is formed.

The substrate 200 is located in a vacuum chamber (not shown), and the vapor-deposition source 302 is located below the substrate 200. The mask 303 is used in a state in which the mask 303 is fixed onto the substrate 200.

Note that used as the mask 303 is, for example, the one whose size is equal to or larger than that of the substrate 200. Alternatively, used as the mask 303 may be the one whose size is smaller than that of the substrate 200. In such the case, vapor deposition particles scattered beyond the shadow mask 303 may be blocked as appropriate by, for example, a deposition preventing plate (shielding plate) by providing a preventing plate (shielding plate) or the like in a non-vapor-deposition region in which no vapor-deposition is required.

The vapor-deposition source 302 may be fixed or movable during the vapor-deposition. In a case where the vapor-deposition source 302 is movable, the line-type vapor-deposition source 103 of a belt shape as that shown in FIG. 6 may be used as the vapor-deposition source 302, for example, and the vapor-deposition may be carried out while the vapor-deposition source 302 and the substrate 200 are being relatively moved. Alternatively, a plane-type vapor-deposition source whose size is substantially the same as that of the substrate 200 may be used as the vapor-deposition source 302, and the vapor-deposition may be carried out at a time on an entire surface of the substrate 200 on which surface a film is to be formed.

Further alternatively, the substrate 200 and the mask 303 may move together (e.g., the substrate 200 and the mask 303 are rotated together).

Note that, in Embodiment 1, the organic EL display device 1 is produced by the same procedures as those in Embodiment 1, except that the vapor-deposition method described above is employed and the vapor-deposited films are produced by the vapor-deposited film patterns which are different from those in Embodiment 1 as shown in FIG. 11.

<Array of Sub Pixels>

The following description will discuss an array of sub pixels according to Embodiment 2.

As described above, in Embodiment 2, a single pixel is constituted by a plurality of sub pixels that are two-dimensionally arrayed.

As shown in FIG. 11, the sub pixels in the single pixel in Embodiment 2 are arrayed in the order of light emitting layers [R], [G], [R], and [B], as well as in Embodiment 1. However, as described above, the sub pixels are arrayed in a tiles-like form (i.e., two-dimensionally arrayed) in Embodiment 2, which is different from that of Embodiment 1.

In a column direction, two lines of sub pixel arrays including (i) an array of [R] and [B] and (ii) an array of [G] and [R] are disposed. Similarly, in a row direction, two lines of sub pixel arrays including (i) an array of [B] and [R] and (ii) an array of [R] and [G] are disposed. That is, in each pixel 2, the light emitting layers of the respective colors, i.e., the sub pixels of the respective colors are arrayed in the order of [R], [G], [R], and [B] either clockwise or counterclockwise.

As a result, [R]s are necessarily disposed so as to face four sides of [G] and four sides of [B].

Note that, for such the arrangement that the sub pixels or the light emitting layers of the respective colors are arrayed in the tiles-like form, it is impossible to employ the scanning vapor-deposition method used in Embodiment 1, i.e., the method of carrying out vapor-deposition while scanning is being carried out with use of the mask 102 for vapor-deposition, the mask 102 being smaller than the substrate 200 on which the film is to be formed.

Therefore, in Embodiment 2, vapor-deposition is carried out while the mask 303 is in close contact with the substrate 200 as shown in FIG. 12.

Note that, in Embodiment 2 as well as in Embodiment 1, light emitting layers are formed in the order of a light emitting layer of B (light emitting layer 23B), a light emitting layer of R (light emitting layers 23R(1) and 23R(2)), and a light emitting layer of G (light emitting layer 23G), for example.

Also in Embodiment 2, the order of descending current efficiencies is [G], [R], and [B], as well as in Embodiment 1.

Further, also in Embodiment 2, the sub pixel of G and the sub pixel of B are not located to be adjacent to each other either in the column or row direction.

Therefore, also in Embodiment 2, it is possible to attain the same effects as those in Embodiment 1. However, in the Embodiment 2, a clearance D between the sub pixel of G and the sub pixel of B corresponds to an oblique pixel pitch as shown in FIG. 11.

In the above Embodiment 1, the sub pixel of G (sub pixel 2G) and the sub pixel of B (sub pixel 2B) are arrayed only in a one-dimensional direction so that the sub pixel of R (sub pixel 2R(2)) is sandwiched between the sub pixel of G (sub pixel 2G) and the sub pixel of B (sub pixel 2B).

As a result, the sub pixel of G and the sub pixel of B are apart from each other by "the width of the light emitting region of R+the widths of the non-light emitting regions".

More specifically, as shown in FIG. 1, the light emitting layer 23G of G and the light emitting region of B are apart from each other by "the width 15R(2) of the light emitting region of R+the width of the non-light emitting region 15$r$(2)×2+the width of the non-light emitting region 15$b$". Further, as shown in FIG. 1, the light emitting layer 23B of B and the light emitting region of G are apart from each other by "the width 15R(2) of the light emitting region of R+the width of the non-light emitting region 15$r$(2)×2+the width of the non-light emitting region 15$g$".

Furthermore, as shown in FIG. 1, the light emitting region of G and the light emitting region of B are apart from each other by "the width 15R(2) of the light emitting region of R+the width of the non-light emitting region 15$g$+the width of the non-light emitting region 15$r$(2)×2+the width of the non-light emitting region 15$b$".

Thus, as compared with Embodiment 1, Embodiment 2 provides a smaller margin in which the light emitting layer 23G of G having a highest current efficiency intrudes into the light emitting region of the light emitting layer 23B having a lowest current efficiency, the light emitting layer 23G and the light emitting layer 23B are obliquely arranged.

However, the margin between the sub pixel of G and the sub pixel of B corresponds to "the width of the non-light emitting region×√2", where the array of the tiles-like form is a square and widths of non-light emitting regions between any sub pixels are identical, for example.

More specifically, a clearance between the light emitting layer 23G of G and the light emitting region of B corresponds to "the width of the non-light emitting region 15$b$×√2", and a clearance between the light emitting layer 23B of B and the light emitting region of G corresponds to "the width of the non-light emitting region 15$g$×√2".

Thus, as compared with the conventional arrangement in which the sub pixel of G and the sub pixel of B are adjacent to each other in the column direction, the margin is improved in Embodiment 2.

Furthermore, Embodiment 2 provides such an advantage that the definition of the R pixel is doubled also in a vertical direction (i.e., a row direction) as compared with Embodiment 1.

In addition, even if misplacement occurs in the light emitting layer patterns either in the vertical direction (column direction) or the horizontal direction (row direction) shown in FIG. 11, the vapor-deposited film pattern of the light emitting layer of G would not intrude into the light emitting region of the light emitting layer of B, and the vapor-deposited film pattern of the light emitting layer of B would not intrude into the light emitting region of the light emitting layer of G.

As described above, according to Embodiment 2, one pixel is configured as follows: the sub pixel of R including the light emitting layer of R having an intermediate current efficiency is disposed between the sub pixel (sub pixel 2G) including the light emitting layer of G having a highest current efficiency and the sub pixel (sub pixel 2B) including the light emitting layer of B having a lowest current efficiency so that the sub pixel including the light emitting layer of G having a highest current efficiency and the sub pixel including the light emitting layer of B having a lowest current efficiency are not adjacent to each other in the column and row directions, the intermediate current efficiency being intermediate between the current efficiency of the light emitting layer of G and the current efficiency of the light emitting layer of B.

This makes it possible to prevent reduction in display quality caused by misplacement of the light emitting layers in the column and row directions.

More preferably, the sub pixel of R including the light emitting layer of R having an intermediate current efficiency is disposed between the sub pixel (sub pixel of G) including the light emitting layer of G having a highest current efficiency and the sub pixel (sub pixel of B) including the light emitting layer of B having a lowest current efficiency so that the sub pixel including the light emitting layer of G having the highest current efficiency and the sub pixel including the light emitting layer of B having the lowest current efficiency are not adjacent to each other also in directions declined from the column and row directions (i.e., obliquely), the intermediate current efficiency being intermediate between the current efficiency of the light emitting layer of G and the current efficiency of the light emitting layer of B.

However, in a case where an adequate distance is provided between two sub pixels obliquely arranged, there is no or a low possibility that the light emitting layer of one of the sub pixels of G and B intrudes into the light emitting region of the other one.

Thus, in such the case, the sub pixel of R, for example, needs not to be disposed between the sub pixel of G and the sub pixel of B as described above so that the sub pixel of G and the sub pixel of B are not obliquely arranged.

On the other hand, in a case where the adequate distance is not provided between two sub pixels obliquely arranged, a light emitting layer or a sub pixel shaped as shown in (b) of FIG. 13 may be formed instead of the arrangement in which the sub pixel of R is disposed between the sub pixel of G and the sub pixel of B as described above so that the sub pixel of G and the sub pixel of B are not adjacent to each other.

(a) and (b) of FIG. 13 are views illustrating an increase in clearance between sub pixels obliquely arranged, the increase being caused by change in shape of a light emitting layer or change in shapes of the light emitting layer and a light emitting region.

(a) and (b) of FIG. 13 each shows a clearance between sub pixels obliquely arranged in the pixel 2 of FIG. 11.

Specifically, (a) of FIG. 13 shows a clearance D between sub pixels obliquely arranged, the clearance D having not been increased. Whereas, (b) of FIG. 13 shows a clearance D' between sub pixels obliquely arranged, the clearance D' having been increased (D<D').

As shown in (b) of FIG. 13, by arranging the oblique sub pixels so that at least either one of (i) light emitting layers and (ii) light emitting regions are formed in an octagonal shape, it is possible to increase the clearance between the oblique two sub pixels (more strictly speaking, a clearance between the light emitting regions of the oblique two light emitting layers), as compared with an arrangement in which the light emitting layers and the light emitting regions are shaped in a quadrangle as shown in (a) of FIG. 13.

This arrangement also makes it possible to prevent the light emitting layer of one of the sub pixels from intruding into the light emitting region of the other one of the sub pixels, and to avoid occurrence of color mixture caused by the intrusion.

Accordingly, it is possible to prevent reduction in display quality caused by the color mixture. As a result, it is possible to provide an organic EL display device 1 excellent in display quality or a TFT substrate 10 serving as a display substrate used to provide such the organic EL display device 1.

<Modification Example of Array of Sub Pixels>

Embodiment 2 also has described the example where a single pixel is constituted by sub pixels of three primary colors. However, Embodiment 2 is not limited to this. That is, the number of colors of sub pixels in one pixel is not limited to three, and may be four or more.

The following description will discuss a case where one pixel is constituted by sub pixels of four colors two-dimensionally arrayed.

FIG. 14 is a view illustrating an example array of sub pixels in a case where the sub pixels of four colors constitute one pixel.

Note that, also in FIG. 14, each sub pixel constituting the single pixel 2 is indicated by solid lines (in FIG. 14, a set of the sub pixels constituting the single pixel 2 is indicated by chain lines), whereas each of the sub pixels constituting some pixels provided in the vicinity of the single pixel 2 is indicated by dashed lines.

Here, assuming that the light emitting layers of the sub pixels of the respective colors are [S1] through [S4], and the order of descending current efficiencies of the light emitting layers of the sub pixels of the respective colors is [S1], [S2], [S3], and [S4] (i.e., [S1] has a highest current efficiency).

In this case, in order to (i) array the sub pixels of the respective colors so that [S1] and [S4] are not adjacent to each other and to (ii) constitute one pixel by as few sub pixels as possible, a pattern of an array shown in FIG. 14 is considered.

In the pattern of the array of the sub pixels shown in FIG. 14, two sub pixels are arrayed in a column direction (a horizontal direction in FIG. 14), and four sub pixels are arrayed in each line, i.e., in each line in a row direction (a vertical direction in FIG. 14).

Specifically, focus on two lines of sub pixels extending in the column direction and assuming that a left one of the two lines is referred to as a first line and a right one of the two lines is referred to as a second line. Then, in the first line, [S1], [S2], and [S3] are arrayed in the order of [S1], [S2], [S3], and [S2] from the top. In the second line, [S2], [S3], and [S4] are arrayed in the order of [S2], [S3], [S4], and [S3] from the top.

The array of the sub pixels in FIG. 14 is made in consideration of the following point in addition to the considerations of (i) arraying the sub pixels of four colors, [S1] through [S4], so that a sub pixel including a light emitting layer having a highest current efficiency and a sub pixel including a light emitting layer having a lowest current efficiency are not adjacent to each other and (ii) constituting one pixel by as few sub pixels as possible.

In order to prevent reduction in display quality caused by a difference in current efficiency as much as possible, the sub pixels may be arrayed so that light emitting layers of two adjacent ones of the sub pixels have a minimum difference in current efficiency.

In view of this, focus on each of the sub pixels in the array in FIG. 14. A sub pixel of a focused color (hereinafter, such the sub pixel is referred to as "focus sub pixel") is disposed adjacent to a sub pixel including a light emitting layer of another color which is the closest to a light emitting layer of the focus color (focus sub pixel) in terms of the order of current efficiencies (magnitude of current efficiency).

For example, as shown in FIG. 14, disposed adjacent to each side of [S1] is [S2] whose order of current efficiency is high next to [S1]. Disposed adjacent to each side of [S2] is [S1] or [S3] whose order of current efficiency is close to that of [S2]. Disposed next to each side of [S3] is [S2] or [S4] whose order of current efficiency is close to that of [S3]. Disposed adjacent to each side of [S4] is [S3] whose order of current efficiency is the secondarily lowest, i.e., is next to that of [S4].

In such the array mode, one pixel includes one sub pixel including a light emitting layer having a highest current efficiency, one sub pixel including a light emitting layer having a lowest current efficiency, and three sub pixels each including a light emitting layer having an intermediate current efficiency which is intermediated between the highest and lowest current efficiencies.

In a case where the above array mode is employed, light emitting layers of sub pixels adjacent to each other in the row and column directions are next to each other in terms of the order of current efficiencies. That is, employing the above array mode allows the light emitting layers of the adjacent sub pixels to have a minimum difference in current efficiency. As a result, it is possible to minimize the effect of the color mixture.

Assuming that the number of colors (kinds) of sub pixels provided in one pixel is M (M≥3), FIG. 15 shows an example array of sub pixels in a case where one pixel is constituted by M kinds of sub pixels so as to satisfy three conditions that (i) the sub pixels of respective colors should be arrayed so that a sub pixel including a light emitting layer having a highest current efficiency and a sub pixel including a light emitting layer having a lowest current efficiency are not adjacent to each other (condition 1), (ii) one pixel should be constituted by as few sub pixels as possible (condition 2), and (iii) the sub pixels should be arrayed so that light emitting layers of two adjacent ones of the sub pixels have a minimum difference in current efficiency (condition 3).

FIG. 15 is a view illustrating an example array of sub pixels in which {(M−2)×2} lines of sub pixels are arrayed in a row direction (a vertical direction in FIG. 15) and two lines of sub pixels are arrayed in a column direction (a horizontal direction in FIG. 15).

Specifically, it is assumed that (i) light emitting layers of sub pixels of respective colors are [S1] through [Sm] (m≥3), (ii) the order of descending current efficiencies thereof is [S1], [S2], . . . , [Sm−1], and [Sm] (i.e., [S1] has a highest current efficiency), and (iii), focusing on two lines of sub pixels extending in the row direction, a left one of the two lines is referred to as a first line and a right one of the two lines is referred to as a second line.

In this case, the pattern of the array of sub pixels shown in FIG. 15 is configured as follows. In the first line, [S1] through [Sm−1] are arrayed in an ascending order. Further, in a case of m≥4, [S1] through [Sm−1] are arrayed in the ascending order as described above and [Sm−2] through [S2] are arrayed in a descending order so as to follow [S1] through [Sm−1] thus arrayed.

Meanwhile, in the second line, [S2] through [Sm] are arrayed in an ascending order. Then, in a case of m≥4, [S2] through [Sm] arrayed in the ascending order as described above and [Sm−1] through [S3] are in a descending order so as to follow [S2] through [Sm] thus arrayed. Hereinafter, this array mode is referred to as "array mode A" for convenience of explanation.

In this array mode A, one pixel includes one sub pixel including a light emitting layer having a highest current efficiency and one sub pixel including a light emitting layer having a lowest current efficiency. In addition to these, the one pixel includes two sub pixels each including a light emitting layer having a current efficiency which is not the maximum or lowest current efficiency.

As described above, in a case where one pixel is constituted by sub pixels of M colors, a pixel satisfying the above conditions 1 through 3 is constituted by at least (M−2)×4 (M≥3) sub pixels.

In a case where the number of sub pixels provided in one pixel is set so that the number of sub pixels in the column direction is equal to the number of sub pixels in the row direction, each of the number of sub pixels in the column direction and the number of sub pixels in the row direction is {(M−2)×2}, and thus the number of sub pixels per pixel is {(M−2)×2}2.

In such the case, not only in the column direction but also in the row direction, the sub pixels are arrayed according to the array mode A so that adjacent ones of the sub pixels have a minimum difference in current efficiency. By increasing the number of sub pixels both in the row and column directions, it is possible to allow one pixel to have a square shape without a need of any particular adjustment on the shapes of individual sub pixels.

[Embodiment 3]

The following describes the present embodiment with reference mainly to (a) through (h) of FIG. 9 and (a) through (d) of FIG. 16. Note that the present embodiment mainly deals with differences between the present embodiment and Embodiments 1 and 2 (particularly, differences between the present embodiment and Embodiment 1). Further, the same reference numerals are denoted to components having similar functions to those of the components described in Embodiments 1 and 2, and a description thereof is omitted.

Each of Embodiments 1 and 2 does not refer to effects given by an order of film formations of light emitting layers of respective colors. However, in order to prevent reduction in display quality caused by misplacement of light emitting layers, the order of film formations is also an important factor. As such, the present embodiment deals with the effects given by the order of film formations.

<Case of Constituting One Pixel by Sub Pixels 2R(1), 2G, 2R(2), and 2B>

First, the following explains a case of providing, between a light emitting layer having a highest current efficiency and a light emitting layer having a lowest current efficiency, a light emitting layer having an intermediate current efficiency which is intermediate between the highest current efficiency and the lowest current efficiency, by taking an example where one pixel is constituted by sub pixels 2R(1), 2G, 2R(2), and 2B as shown in (a) through (h) of FIG. 9.

In the pattern (1) shown in (a) of FIG. 9, focus on the overlapping region (color mixture region). Of the light emitting layers 23R(1) and 23G, the light emitting layer 23R(1) is a lower layer, whereas the light emitting layer 23G is an upper layer. This is the same also in the pattern (3) shown in (c) of FIG. 9.

In the pattern (5) shown in (e) of FIG. 9, focus on the overlapping region (color mixture region). Of the light emitting layers 23R(2) and 23B, the light emitting layer 23B is a lower layer, whereas the light emitting layer 23R(2) is an upper layer. This is the same also in the pattern (7) shown in (g) of FIG. 9.

That is, in (a), (c), (e), and (g) of FIG. 9, the light emitting layers are vapor-deposited in the order of ascending current efficiencies of light emitting layers. That is, the light emitting layers are vapor-deposited so that a light emitting layer having a lower current efficiency is vapor-deposited earlier in a process of vapor-depositing the light emitting layers 23R, 23G, and 23B in the step S3 after the first electrode 21, which serves as the anode, is formed in the above step S1.

Typically, a light emitting layer of an organic EL element has a nature of being more facilitated to emit light as the light emitting layer is located in a region closer to the anode.

Thus, in the pattern (1) shown in (a) of FIG. 9, the light emitting layer 23R(1), which is the lower layer in the color mixture region and into which the light emitting layer 23G intrudes, is more facilitated to emit light than the light emitting layer 23G.

Similarly, in the pattern (5) shown in (e) of FIG. 9, the light emitting layer 23B, which is the lower layer in the color mixture region and into which the light emitting layer 23R(2) intrudes, is more facilitated to emit light than the light emitting layer 23R(2).

On the other hand, in the pattern (3) shown in (c) of FIG. 9, the light emitting layer 23R(1), which is the lower layer in the color mixture region and intrudes into the light emitting layer 23G, is more facilitated to emit light than the light emitting layer 23G. However, since the light emitting layer 23R(1), which is the lower layer, has a lower current efficiency than that of the light emitting layer 23G, which is the upper layer, the effect is offset (canceled).

Meanwhile, in the pattern (7) shown in (g) of FIG. 9, the light emitting layer 23B, which is the lower layer in the color mixture region and intrudes into the light emitting layer 23R(2), is more facilitated to emit light than the light emitting layer 23R(2). However, since the light emitting layer 23B, which is the lower layer, has a lower current efficiency than that of the light emitting layer 23R(2), which is the upper layer, the effect is offset (canceled).

As described in Embodiment 1, in the patterns (1) through (8) respectively shown in (a) through (h) of FIG. 9, there provided, between the light emitting layer 23G having a highest current efficiency and the light emitting layer 23B having a lowest current efficiency, the light emitting layer 23R(2) having an intermediate current efficiency which is intermediate between the highest current efficiency and the lowest current efficiency, thereby making it possible to reduce the effect of the color mixture.

The effect of reducing the effect of the color mixture can be further enhanced by setting the order of film formations of the light emitting layers 23R(1), 23G, 23R(2), and 23B so that it corresponds to the order of ascending current efficiencies (i.e., herein, the order of [B], [R], and [G]) as described above.

<Case of Constituting One Pixel According to Conventional Arrangement>

Note that the present embodiment is not limited to the cases of providing, between a light emitting layer having a highest current efficiency and a light emitting layer having a lowest current efficiency, a light emitting layer having an intermediate current efficiency which is intermediate between the highest current efficiency and the lowest current efficiency as described above.

For example, even if each pixel 2 has such an array of sub pixels according to the conventional arrangement that (i) the pixel 2 is constituted by three sub pixels of a sub pixel of R, a sub pixel of B, and a sub pixel of G and (ii) a light emitting layer of G and a light emitting layer of B are adjacent to each other, setting the order of film formation as described above makes it possible to prevent reduction in display quality caused by misplacement of light emitting layers.

(a) through (d) of FIG. 16 are schematic views each illustrating a modification example of an array of sub pixels constituting a single pixel 2 in an organic EL display device 1.

Assumed herein is, as shown in each of (a) through (d) of FIG. 16, a case where misplacement occurs in any of light emitting layers 23R, 23G, and 23B respectively included in sub pixels 2R, 2G, and 2B constituting a single pixel 2, so that a light emitting layer of one of two adjacent ones of the sub pixels intrudes into a light emitting region of the other one.

Note that, in (a) through (d) of FIG. 16, the light emitting regions in the sub pixels of the respective colors of R, G, and B are respectively indicated by the exposed sections 15R, 15G, and 15B in the respective edge covers 15 of the sub pixels 2R, 2G, and 2B.

In the array of sub pixels according to the conventional arrangement, four intrusion patterns (patterns (I) through (IV)) respectively shown in (a) through (d) of FIG. 16 are assumed.

Pattern (I): In this pattern, as shown in (a) of FIG. 16, after formation of the light emitting layer 23R of the sub pixel 2R, the light emitting layer 23G of the sub pixel 2G intrudes into the light emitting region in a region where the exposed section 15R of the sub pixel 2R is formed.

Pattern (II): In this pattern, as shown in (b) of FIG. 16, prior to formation of the light emitting layer 23G of the sub pixel 2G, the light emitting layer 23R of the sub pixel 2R intrudes into the light emitting region in a region where the exposed section 15G of the sub pixel 23G is formed.

Pattern (III): In this pattern, as shown in (c) of FIG. 16, after formation of the light emitting layer 23B of the sub pixel 2B, the light emitting layer 23G of the sub pixel 2G intrudes into the light emitting region in a region where the exposed section 15B of the sub pixel 2B is formed.

Pattern (IV): In this pattern, as shown in (d) of FIG. 16, prior to formation of the light emitting layer 23G of the sub pixel 2G, the light emitting layer 23B of the sub pixel 2B intrudes into the light emitting region in a region where the light emitting layer 23G of the sub pixel 2G is formed.

Here, for example, in the pattern (I) shown in (a) of FIG. 16, focus on an overlapping region. Of the light emitting layers 23R and 23G, the light emitting layer 23R is a lower layer, and the light emitting layer 23G is an upper layer. This is the same also in the pattern (II) shown in (b) of FIG. 16.

In the pattern (III) shown in (c) of FIG. 16, focus on an overlapping region (color mixture region). Of the light emitting layers 23G and 23B, the light emitting layer 23B is a lower layer, and the light emitting layer 23G is an upper layer. This is the same also in the pattern (IV) shown in (d) of FIG. 16.

That is, also in (a) through (d) of FIG. 16, the light emitting layers are vapor-deposited in the order of ascending current efficiencies of light emitting layers, i.e., a light emitting layer having a lower current efficiency is vapor-deposited earlier, in a case where the second electrode 26, which serves as the cathode, is formed after formation of the first electrode 21, which serves as the anode.

With this, it is possible to prevent reduction in display quality caused by misplacement of light emitting layers, regardless of the kinds (colors) and the number of sub pixels provided in one pixel, as described above.

Note that, in a case where the first electrode 21 serves as the cathode and the second electrode 26 serves as the anode, the order of laminating the light emitting layers is reversed. That is, after the first electrode 21 is formed, a light emitting layer having a higher current efficiency may be vapor-deposited earlier.

In other words, the light emitting layers of the respective colors may be formed according to the order of current efficiencies of the light emitting layers of the respective colors. Specifically, the light emitting layers of the respective colors may be formed so that, even if light emitting layers having different colors are overlapped with each other, one with a lower current efficiency is located closer to the anode than the other with a higher current efficiency in the overlapping region.

[Embodiment 4]

The following describes the present embodiment with reference mainly to FIGS. 17 and 18. Note that the present embodiment mainly deals with differences between the present embodiment and Embodiments 1 through 3. Further, the same reference numerals are denoted to components having similar functions to those of the components described in Embodiments 1 through 3, and a description thereof is omitted.

Embodiments 1 through 3 have dealt with the case where at least three vapor-deposited film patterns having different current efficiencies are formed in the same plane of the display substrate, and two adjacent ones of the light emitting regions are a combination other than a combination of (i) a light emitting region including a light emitting layer of a color having a highest current efficiency and (ii) a light emitting region including a light emitting layer of a color having a lowest current efficiency.

However, in a case where (i) vapor-deposited film patterns having different current efficiencies are such patterns that some problems occur if one of the vapor-deposited films intrudes into a sub pixel region of another one of the vapor-deposited films adjacent to the one vapor-deposited film and (ii) a consideration is made in order to change an array having such the vapor-deposited film patterns based on characteristics due to which the intrusion of the one vapor-deposited film into the sub pixel region of the another vapor-deposited film causes some problems, a similar idea to the consideration can be applied to an array having another vapor-deposited film patterns in which some problems occur if one of the vapor-deposited films intrudes into a sub pixel region of another one of the vapor-deposited films adjacent to the one vapor-deposited film causes.

Considered as an example of this is as follows: In a case where a total film thickness of sub pixels of respective colors needs to be changed in order to optimize a microcavity effect, adjustment is carried out on layers (e.g., hole transporting layers) other than light emitting layers.

FIG. 17 is a cross-sectional view illustrating a schematic arrangement of an organic EL display device 1 in accordance with the present embodiment.

As shown in FIG. 17, in the present embodiment, a film thickness of a hole transporting layer is optimized by individually changing film thicknesses for R, G, and B, i.e., for sub pixels 2R, 2G, and 2B.

In the present embodiment, as shown in FIG. 17, each pixel 2 is constituted by four sub pixels 2B(1), 2R, 2B(2), and 2G, specifically, blue sub pixels 2B(1) and 2B(2) each emitting blue light, a red sub pixel 2R emitting red light, and a green sub pixel 2G emitting green light.

The sub pixels 2B(1), 2R, 2B(2), and 2G are provided with their respective light emitting layers 23B(1), 23R, 23B(2), and 23G.

Further, the organic EL display device 1 shown in FIG. 17 includes a hole injecting layer 22A and hole transporting layers 28B(1), 28R, 28B(2), and 28G, instead of the hole injecting layer and hole transporting layer 22 included in the organic EL display device 1 shown in FIG. 3. The hole transporting layers 28B(1), 28R, 28B(2), and 28G are made from the same material, and differ from each other only in terms of the film thickness.

In respective exposed sections 15B(1), 15R, 15B(2), and 15G in the sub pixels 2B(1), 2R, 2B(2), and 2G, (i) the hole transporting layer 28B(1) and a light emitting layer 23B(1), (ii) the hole transporting layer 28R and a light emitting layer 23R, (iii) the hole transporting layer 28B(2) and a light emitting layer 23B(2), and (iv) the hole transporting layer 28G and a light emitting layer 23G are laminated in this order from the hole injecting layer 22A side so that each hole transporting layer and its corresponding light emitting layer are adjacent to each other.

In Embodiment 4, selective forming is carried out not only for the light emitting layers 23B(1), 23R, 23B(2), and 23G but also for the hole transporting layers 28B(1), 28R, 28B(2), and 28G.

FIG. 18 is a flowchart showing steps of producing the organic EL display device 1 of FIG. 17 in the order of steps.

A method of producing the organic EL display device 1 of the present embodiment includes, as shown in FIG. 18, a hole injecting layer vapor-deposition step (S21) and a hole transporting layer vapor-deposition step (S22), instead of the hole injecting layer and hole transporting layer vapor-deposition step (S2).

Note that steps other than the step S2 in the method of the present embodiment are basically the same as those in Embodiment 1, except for a change (i.e., a change in a mask pattern) caused by changing the configuration of each pixel 2 so that the pixel 2 is constituted by the sub pixels 2B(1), 2R, 2B(2), and 2G. Therefore, explanation of the steps other than the hole injecting layer vapor-deposition step (S21) and the hole transporting layer vapor-deposition step (S22) are omitted in the present embodiment.

In the present embodiment, a TFT substrate 10 formed in a similar manner to the TFT substrate forming step (S1) in Embodiment 1 is first subjected to baking under reduced pressure for desiccation and oxygen plasma treatment for washing a surface of a first electrode 21, as well as in Embodiment 1.

After that, the hole injecting layer 22A is vapor-deposited on an entire display region of the TFT substrate 10 with a conventional vapor-deposition device in a similar manner to that in Embodiment 1 (S21).

In the present embodiment, the hole injecting layer 22A is made from m-MTDATA (4,4'4"-tris(N-3-methylphenyl-N-phenylamino)-triphenylamine), and is formed to have a film thickness of 30 nm.

Next, with use of the vapor-deposition device 150 described in Embodiment 1, the hole transporting layers 28B(1), 28R, 28B(2), and 28G are selectively vapor-deposited (S22).

That is, the hole transporting layer 28R of the sub pixel 2R, for example, is first formed by a vapor-deposition method which is the same as that for the light emitting layers 23B(1), 23R, 23B(2), and 23G except for the material.

Next, the position of the TFT substrate 10 on which the hole transporting layer 28R is formed is moved in a direction orthogonal to the substrate scanning direction. Then, the hole transporting layers 28B(1) and 28B(2) of the respective sub pixels 2B(1) and 2B(2) are formed in a similar manner to that for the hole transporting layer 28R.

After that, the position of the TFT substrate 10 on which the hole transporting layers 28B(1), 28R, and 28B(2) are formed is moved in the direction orthogonal to the substrate scanning direction. Then, the hole transporting layer 28G of the sub pixel 2G is formed in a similar manner to those for the hole transporting layers 28B(1), 28R, and 28B(2).

It is possible to change the film thickness of each of the hole transporting layers 28B(1), 28R, 28B(2), and 28G in such a manner that a speed of scanning the TFT substrate 10, which is the substrate 200 on which the film is to be formed, and/or the number of scanning carried out reciprocatively are changed individually for each of the sub pixels 2B(1), 2R, 2B(2), and 2G.

In the present embodiment, the order of ascending film thicknesses of the hole transporting layers 28B(1), 28R, 28B(2), and 28G corresponds to the order of the sub pixel 2R, the sub pixels 2B(1) and 2B(2), and the sub pixel 2G (i.e., the order of ascending film thicknesses is the hole transporting layer 28R, the hole transporting layers 28B(1) and 28B(2), and the hole transporting layer 28G).

In the present embodiment, the hole transporting layers 28B(1), 28R, 28B(2), and 28G are made from α-NPD, and are formed to have film thicknesses of 100 nm, 50 nm, 100 nm, and 150 nm, respectively.

By changing the respective film thicknesses of the hole transporting layers 28B(1), 28R, 28B(2), and 28G according to the colors of the sub pixels (the sub pixels 2B(1), 2R, 2B(2), and 2G), it is possible to optimize the microcavity effect for each of the colors.

Note that the microcavity effect refers to such a phenomenon that light generated in a space between the first electrode 21 and the second electrode 26 moves reciprocatively therebetween so as to cause resonance due to an optical resonance structure formed in each of the sub pixels of the respective colors (e.g., R, G, and B), resulting in narrowing of a spectrum of the emitted light and an improvement of color purity.

An optical distance causing the optimum microcavity effect varies depending on the wavelength of emitted light of each color. Therefore, it is necessary to individually adjust the optical distances of the respective colors. Methods therefor include the method of changing a film thickness of a certain organic layer as described above.

In a case where the film thicknesses of the hole transporting layers 28B(1), 28R, 28B(2), and 28G are changed according to the colors (the sub pixels 2B(1), 2R, 2B(2), and 2G), a total film thickness varies at a boundary between adjacent sub pixels whose hole transporting layers have a difference in film thickness. Particularly, in a case where a hole transporting layer of G having a maximum film thickness and a hole transporting layer of R having a minimum film thickness are adjacent to each other, a great difference in total film thickness occurs between such the adjacent sub pixels.

In order to reduce the change in total film thickness as much as possible, the present embodiment allows to (i) use, as a parameter for determining a pattern of an array of sub pixels, a film thickness of a hole transporting layer instead of the current efficiency of the light emitting layer, and to (ii) determine the pattern of the array of the sub pixels so that hole transporting layers of adjacent ones of the sub pixels have a minimum difference in film thickness.

In this case, merely by replacing the difference in current efficiency of the light emitting layer with the difference in film thickness of the hole transporting layer, it is possible to reduce the above change in a total film thickness without enlarging non-light emitting regions between the sub pixels. As a result, it is possible to enhance reliability and display quality of the organic EL display device 1.

Here, in a case where the pattern of the array of the sub pixels in each pixel 2 is set to the one in which the sub pixels are arrayed in the order of 2B(1), 2R, 2B(2), and 2G as shown in FIG. 17, the sub pixel 2B(2) and the sub pixel 2G are adjacent to each other.

In such the case, it is only necessary to form (i) such light emitting layers of G, B, and R that the order of descending current efficiencies of the light emitting layers is [G], [B], and [R] or (ii) such light emitting layers of G, B, and R that the order of descending current efficiencies of the light emitting layers is [R], [B], and [G], as described above.

Alternatively, it is only necessary to form the light emitting layers 23B(1), 23R, 23B(2), and 23G according to the order of ascending current efficiencies, as described above. That is, in a case of using such light emitting layers of G, B, and R that the order of ascending current efficiencies of the light emitting layers is [B], [R], and [G], the light emitting layers 23B(1), 23R, 23B(2), and 23G may be formed in the order of the light emitting layers 23B(1) and 23B(2), the light emitting layer 23R, and the light emitting layer 23G.

The order of forming the hole transporting layers of the respective colors and the order of forming the light emitting layers of the respective colors do not necessarily correspond to each other. As described above, the order of forming the hole transporting layers of the respective colors and the order of forming the light emitting layers of the respective colors may be changed as necessary for each layer according to the parameter for determining the pattern of the array.

Note that, in the present embodiment, the film thicknesses of the hole transporting layers 28B(1), 28R, 28B(2), and 28G are changed according to the colors as described above. However, the present embodiment is not limited to this. Not only the hole transporting layers 28B(1), 28R, 28B(2), and 28G but also the hole injecting layer 22A, the electron transporting layer 24, the electron injecting layer 25, and/or the above-mentioned carrier blocking layer (not shown) may be formed so that they have different film thicknesses according to the colors.

<Summary of Main Points>

As described above, a display substrate in accordance with each Embodiment includes: a plurality of pixel regions each including, as sub pixel regions, light emitting regions of at least three colors, each light emitting region being included in a light emitting layer made from a vapor-deposited film, two adjacent ones of the light emitting regions being a combination other than a combination of (i) a light emitting region included in a light emitting layer of a color having a highest current efficiency and (ii) a light emitting region included in a light emitting layer of a color having a lowest current efficiency, the highest current efficiency and the lowest current efficiency being efficiencies observed in a case where the light emitting layers of the light emitting regions of the at least three colors emit light having an identical luminance.

Further, as described above, a method of producing a display substrate including a plurality of pixel regions each including, as sub pixel regions, light emitting regions of at least three colors, each light emitting region being included in a light emitting layer made from a vapor-deposited film, the method in accordance with the present invention includes the step of: forming the light emitting layers such that a first light emitting layer(s) is sandwiched between a second light emitting layer and a third light emitting layer, which, in a case where all the light emitting layers of the light emitting regions of the at least three colors emit light having an identical luminance, second light emitting layer displays a color having a highest current efficiency, third light emitting layer displays a color having a lowest current efficiency, and first light emitting layer(s) displays/display a color(s) having a current efficiency (efficiencies) which is/are less than the highest current efficiency but more than the lowest current efficiency.

According to the above arrangement and the method, the present invention can reduce a difference in current efficiency between the two adjacent ones of the light emitting regions more than a conventional arrangement in which a light emitting region included in a light emitting layer of a color having the highest current efficiency is adjacent to a light emitting region included in a light emitting layer of a color having the lowest current efficiency. Therefore, even if the light emitting layer (vapor-deposited film) of the one of the two adjacent ones of light emitting regions intrudes into the other light emitting region in the process of production of the display substrate, a degree of color mixture (a degree of change in color) caused by such intrusion in the present invention can be more reduced than in the conventional arrangement. Accordingly, it is possible to prevent reduction in display quality caused by misplacement of a vapor-deposited film without increasing non-light emitting regions.

Further, in the display substrate, it is desired that the light emitting regions of the light emitting layers of the at least three colors be arranged in a one-dimensional direction and be arranged so that the light emitting layers of the two adjacent ones of the light emitting regions have a minimum difference in current efficiency.

Further, in the method of producing the display substrate, it is desired that the light emitting layers of the at least three colors be formed so that (i) the light emitting regions of the light emitting layers are arranged in a one-dimensional direction and (ii) two adjacent ones of the light emitting regions have a minimum difference in current efficiency.

According to the arrangement and the method, in a case where a light emitting layer of one of the two adjacent ones of the light emitting regions intrudes into the other light emitting region in the one-dimensional direction, a degree of color mixture (a degree of change in color) caused by such intrusion can be minimized. This minimizes reduction in image quality.

Further, in the display substrate, it is desired that the sub pixel regions of each of the plurality of pixel regions be at least $(M-1) \times 2$ light emitting regions having M ($M \geq 3$) colors;

and in each of the plurality of pixel regions, one of the light emitting layers displays the color having the highest current efficiency and another one of the light emitting layers displays the color having the lowest current efficiency.

According to the above arrangement, sub pixel regions can be arranged such that a sub pixel region having the highest current efficiency is not adjacent to a sub pixel region having the lowest current efficiency, and the number of sub pixel regions to constitute a single pixel can be reduced as much as possible.

Further, in the display substrate, it is desired that the light emitting layers of the light emitting regions be a light emitting layers of green, a light emitting layers of red, and a light emitting layers of blue; and the light emitting region included in the light emitting layer of red be sandwiched between the light emitting region included in the light emitting layer of green and the light emitting region included in the light emitting layer of blue.

According to the above arrangement, the present invention can reduce a difference in current efficiency between the two adjacent ones of the light emitting regions more than an arrangement in which a light emitting region included in a light emitting layer of green having the highest current efficiency is adjacent to a light emitting region included in a light emitting layer of blue having the lowest current efficiency.

Further, in the display substrate, it is desired that the light emitting layers of the light emitting regions be a light emitting layers of green, a light emitting layers of yellow, a light emitting layers of red, and a light emitting layers of blue; and the light emitting region included in the light emitting layer of yellow and the light emitting region included in the light emitting layer of red be sandwiched between the light emitting region included in the light emitting layer of green and the light emitting region included in the light emitting layer of blue.

According to the above arrangement, the present invention can reduce a difference in current efficiency between the two adjacent ones of the light emitting regions more than an arrangement in which a light emitting region included in a light emitting layer of green having the highest current efficiency is adjacent to a light emitting region included in a light emitting layer of blue having the lowest current efficiency.

Further, in the display substrate, it is desired that the light emitting regions of the light emitting layers are arranged in a two-dimensional direction, and are arranged so that (i) the light emitting layers of the two adjacent ones of the light emitting regions, which are adjacent to each other in a one-dimensional direction, have a minimum difference in current efficiency, and (ii) the light emitting layers of the two adjacent ones of the light emitting regions, which are adjacent to each other in a direction orthogonal to the one-dimensional direction, have a minimum difference in current efficiency.

Further, in the method of producing a display substrate, desirably, the light emitting layers are formed so that (i) the light emitting regions are arranged in a two-dimensional direction, (ii) two adjacent ones of the light emitting regions, which are adjacent to each other in a one-dimensional direction, have a minimum difference in current efficiency, and (iii) the two adjacent ones of the light emitting regions, which are adjacent to each other in a direction orthogonal to the one-dimensional direction, have a minimum difference in current efficiency.

According to the above arrangement and the method, in a case where a light emitting layer of one of the two adjacent ones of the light emitting regions intrudes into the other light emitting region in the one-dimensional direction, or in a case where the light emitting layer of the one of the two adjacent ones of light emitting regions intrudes into the other light emitting region in a direction orthogonal to the one-dimensional direction, a degree of color mixture (a degree of change in color) caused by such intrusion can be minimized. This minimizes reduction in image quality.

Further, in the display substrate, it is desired that the sub pixel regions of each of the plurality of pixel regions be at least $(M-2) \times 4$ light emitting regions of M ($M \geq 3$) colors; and, in each of the plurality of pixel regions, one of the light emitting layers display the color having the highest current efficiency and another one of the light emitting layers display the color having the lowest current efficiency.

According to the above arrangement, sub pixel regions can be arranged such that (i) a sub pixel region having the highest current efficiency is not adjacent to a sub pixel region having the lowest current efficiency, and the number of sub pixel regions to constitute a single pixel can be reduced as much as possible and (ii) a pixel having a minimum difference between current efficiencies of the two adjacent sub pixel regions is formed.

Further, in the display substrate, it is desired that the sub pixel regions of each of the plurality of pixel regions be at least $\{(M-2) \times 2\}^2$ light emitting regions of M ($M \geq 3$) colors.

According to the above arrangement, sub pixel regions can be arranged such that (i) a sub pixel region having the highest current efficiency is not adjacent to a sub pixel region having the lowest current efficiency, and the number of sub pixel regions to constitute a single square pixel can be reduced as much as possible and (ii) a pixel having a minimum difference between current efficiencies of the two adjacent sub pixel regions is formed.

Further, in a case where the light emitting regions included in the light emitting layers of the respective colors are arranged in a two-dimensional direction as described above, it is desired that the light emitting layers or the light emitting regions have an octagonal shape.

This can increase a clearance between light emitting regions included in the two light emitting layers which are obliquely arranged. Therefore, it is possible to prevent one of the two light emitting layers from intruding into a light emitting region of the other light emitting layer, so that color mixture caused by the above causes can be reduced.

Therefore it is possible to provide an organic electroluminescence display device which prevents reduction in image quality and is excellent in display quality.

Further, in the display substrate, it is desired that each of the light emitting regions include a thin film transistor.

In a case where each light emitting region includes a thin film transistor as described above and therefore constitute a display panel, i.e., in a case where, for example, an organic electroluminescence display device is produced with use of the above display substrate, it is possible to improve definition of sub pixels in a single pixel, the sub pixels having light emitting layers of the identical color.

Further, as described above, in a display substrate in accordance with an example of the above Embodiments, at least three vapor-deposited film patterns having different film thicknesses are formed in the same plane of the display substrate; and two adjacent ones of the at least three vapor-deposited film patterns are a combination other than a combination of the pattern having a thickest vapor-deposited film and the pattern having a thinnest vapor-deposited film.

According to the above arrangement, at least three vapor-deposited film patterns having different film thicknesses are formed in the same plane of the display substrate, and two adjacent ones of the at least three vapor-deposited film patterns being a combination other than a combination of the pattern having a thickest vapor-deposited film and the pattern having a thinnest vapor-deposited film. This reduces a difference between film thicknesses of the two adjacent ones of the at least three vapor-deposited film patterns in the present invention more than that in an arrangement in which the pattern of the thickest vapor-deposited film is adjacent to the pattern of the thinnest vapor-deposited film.

As a result, even if a vapor-deposited film having one of the two adjacent patterns intrudes into a region to which a vapor-deposited film having the other pattern is formed, a total thickness variation caused by such intrusion can be prevented by appropriately setting the thicknesses of the vapor-deposited films.

Therefore, it is possible to prevent reduction in display quality caused by misplacement of a vapor-deposited film without increasing non-light emitting regions.

Further, as described above, an organic electroluminescence display device in accordance with each Embodiment includes a display substrate in any one of Embodiments.

With this arrangement, it is possible to produce an organic electroluminescence display device having an effect brought by any one of the above arrangements.

Further, as described above, a method of producing an organic electroluminescence display device in accordance with each Embodiment desirably includes the steps of: (a) forming an anode; (b) forming a cathode; and (c) forming vapor-depositing light emitting layers of at least three colors on a color-by-color basis, the step (c) being carried out between the step (a) and the step (b), wherein, in the step (c), the lower current efficiency a light emitting layer has, the earlier the light emitting layer is formed after the step (a), the lower current efficiency being efficiency observed in a case where the light emitting layers of the light emitting regions of the at least three colors emit light having an identical luminance.

According to the above method, even if the light emitting layer which intrudes into the region is nearer the anode or vice versa, the influence of the color mixture, if the color mixture occurs, can be reduced by forming the light emitting layers in the above order. Accordingly, a vapor-deposited film of one of two adjacent ones of light emitting regions intrudes into a region of the other light emitting region on which a vapor-deposited film is formed, a degree of color mixture (a degree of change in color) caused by such intrusion in the present invention can be more reduced. As a result, it is possible to prevent reduction in image quality.

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

Industrial Applicability

The present invention can be suitably used for, for example, a display substrate which is subjected to a film formation process such as selective vapor-deposition on organic layers in an organic EL display device, the organic EL display device, a method of producing the display substrate, and a method of producing the organic EL display device.

REFERENCE SIGNS LIST 1 organic EL display device
2 pixel
2R, 2R(1), 2R(2), 2G, 2B, 2B(1), 2B(2) sub pixel
10 TFT substrate (display substrate)
11 insulating substrate
12 TFT (thin film transistor)
13 interlayer insulating film
13a contact hole
14 wire
14G gate line
14S source line
14V power supply wire
15 edge cover
15R, 15R(1), 15R(2) exposed section
15G exposed section
15B, 15B(1), 15B(2) exposed section
15r, 15g, 15r, 15b non-light emitting region
20 organic EL element
21 first electrode
22 hole injecting layer serving as hole transporting layer
22A hole injecting layer
23R, 23R(1), 23R(2) light emitting layer
23G light emitting layer
23B, 23B(1), 23B(2) light emitting layer
24 electron transporting layer
25 electron injecting layer
26 second electrode
28B(1), 28R, 28B(2), 28G hole transporting layer
30 adhesive layer
40 sealing substrate
102 mask
102a opening
103 vapor-deposition source
103a injection port
150 vapor-deposition device
200 film formation substrate
300 limiting plate
301 opening
302 vapor-deposition source
303 mask
304 opening
500 mask unit
600 vacuum chamber

The invention claimed is:

1. A method of producing an organic electroluminescence display device, comprising the steps of:
  (a) forming an anode by patterning;
  (b) forming a cathode; and
  (c) forming light emitting layers of at least three colors in the same plane of the display substrate sequentially on a color-by-color basis, the step (c) being carried out between the step (a) and the step (b), each of the light emitting layers being made from a vapor-deposited film,
wherein: in the step (c),
light emitting regions of the at least three colors which light emitting regions are included in the respective light emitting layers each made from the vapor-deposited film are arranged in a one-dimensional direction;
the light emitting layers of the light emitting regions of the at least three colors are formed such that (i) at least one first light emitting layer is located between a second light emitting layer and a third light emitting layer, wherein the second light emitting layer displays a color having a highest current efficiency, the third light emitting layer displays a color having a lowest current efficiency, and the at least one first light emitting layer displays corresponding color having a current efficiency less than the highest current efficiency and more than the lowest current efficiency, in accordance with the at least three colors being three colors, a quantity of the at least one first light emitting layer is one and in accordance with the at least three colors being four or more colors, a quantity of the at least one first light emitting layer is two or more, and (ii) the light emitting layers are provided such that current efficiencies of the light emitting layers other than the second light emitting layer increase with increasing proximity to the second light emitting layer while current efficiencies of the light emitting layers other than the third light emitting layer decrease with increasing proximity to the third light emitting layer;

the anode and the cathode sandwiching the light emitting layers therebetween, the anode and the cathode being provided at a lower position and at a higher position, respectively, than the light emitting layers or being provided at a higher position and at a lower position, respectively, than the light emitting layers, the second light emitting layer and the third light emitting layer, being located so as not to be adjacent to each other in a horizontal direction of the display substrate; and a respective light emitting layer of one of two adjacent light emitting regions overlaps a respective light emitting layer of the other of the two adjacent light emitting regions in an overlapping area provided at a boundary between the light emitting layers of the two adjacent light emitting regions, wherein, in the overlapping area, a light emitting layer having a lower current efficiency out of the light emitting layers of the two adjacent light emitting regions is located closer to the anode than to the cathode, and wherein each of the two adjacent light emitting regions includes a non-overlapping area where the light emitting layers of the two adjacent light emitting regions do not overlap each other while having different colors.

2. An organic electroluminescence display device comprising:

a display substrate;

the display substrate including:

(i) a plurality of pixel regions each including, as sub pixel regions, light emitting regions of at least three colors, the light emitting regions being included in respective light emitting layers made from vapor-deposited films, the light emitting regions of the at least three colors, being arranged in a one-dimensional direction, the light emitting layers of the light emitting regions of the at least three colors, being provided, when viewed from above, such that (i) at least one first light emitting layer is located between a second light emitting layer and a third light emitting layer, wherein the second light emitting layer displays a color having a highest current efficiency, the third light emitting layer displays a color having a lowest current efficiency, and the at least one first light emitting layer displays a corresponding color having a current efficiency which is less than the highest current efficiency but more than the lowest current efficiency, wherein one first light emitting layer corresponds to light emitting regions that have three colors and two or more first light emitting layers correspond to light emitting regions that have four or more colors, and (ii) the light emitting layers are provided such that current efficiencies of the light emitting layers other than the second light emitting layer increase with increasing proximity to the second light emitting layer while current efficiencies of the light emitting layers other than the third light emitting layer decrease with increasing proximity to the third light emitting layer;

(ii) an anode; and (iii) a cathode, the anode and the cathode sandwiching the light emitting layers therebetween, the anode and the cathode being provided at a lower position and at a higher position, respectively, than the light emitting layers or being provided at a higher position and at a lower position, respectively, than the light emitting layers, the second light emitting layer and the third light emitting layer, being located so as not to be adjacent to each other in a horizontal direction of the display substrate, a respective light emitting layer of one of two adjacent light emitting regions overlaps a respective light emitting layer of the other of the two adjacent light emitting regions in an overlapping area provided at a boundary between the light emitting layers of the two adjacent light emitting regions, wherein, in the overlapping area, a light emitting layer having a lower current efficiency out of the light emitting layers of the two adjacent light emitting regions is located closer to the anode than to the cathode, and wherein each of the two adjacent light emitting regions includes a non-overlapping area where the light emitting layers of the two adjacent light emitting regions do not overlap each other while having different colors.

3. An organic electroluminescence display device comprising:

a display substrate;

the display substrate including:

(i) light emitting regions of at least three colors, the light emitting regions being included in respective light emitting layers made from vapor-deposited films, the display substrate being such that: at least three vapor-deposited film patterns having different film thicknesses depending on the light emitting regions are formed in the same plane of the display substrate; and two adjacent at least three vapor-deposited film patterns, which are formed in the same plane of the display substrate, are a combination other than a combination of the pattern having a thickest vapor-deposited film and the pattern having a thinnest vapor-deposited film, wherein the at least three vapor-deposited film patterns are provided such that thicknesses of the vapor-deposited film patterns other than the pattern having the thickest vapor-deposited film increase with increasing proximity to the pattern having the thickest vapor-deposited film, while the thicknesses of the vapor-deposited film patterns other than the pattern having the thinnest vapor-deposited film decrease with increasing proximity to the pattern having the thinnest vapor-deposited film;

(ii) an anode; and (iii) a cathode, the anode and the cathode sandwiching the light emitting layers and the vapor-deposited film patterns therebetween, the anode and cathode being provided at a lower position and at a higher position, respectively, than the light emitting layers and the vapor-deposited film patterns or being provided at a higher position and at a lower position, respectively, than the light emitting layers and the vapor-deposited film patterns, respectively, the vapor-deposited film pattern corresponding to a respective light emitting layer of one of two adjacent light emitting regions overlaps a respective light emitting layer of the other of the two adjacent light emitting regions in an overlapping area provided at a boundary between the light emitting layers of the two adjacent light emitting regions, wherein, in the overlapping area, a light emitting layer having a lower current efficiency out of the light emitting layers of the two adjacent light emitting regions is located closer to the anode than to the cathode, and wherein each of the two adjacent light emitting regions includes a non-overlapping area where the light emitting layers of the two adjacent light emitting regions do not overlap each other while having different colors.

4. The organic electroluminescence display device as set forth in claim 2, wherein:
the sub pixel regions of each of the plurality of pixel regions are at least (M −1)×2 light emitting regions having M colors, where M is an integer that is 3 or higher; and
in each of the plurality of pixel regions, one of the light emitting layers displays the color having the highest current efficiency and another one of the light emitting layers displays the color having the lowest current efficiency.

5. The organic electroluminescence display device as set forth in claim 2, wherein:
the light emitting layers of the light emitting regions are a light emitting layers of green, a light emitting layers of red, and a light emitting layers of blue; and
the second light emitting layer is a light emitting layer of green, the third light emitting layer is a light emitting layer of blue, the at least one first light emitting layer is a light emitting layer of red.

6. The organic electroluminescence display device as set forth in claim 2, wherein:
the light emitting layers of the light emitting regions are a light emitting layers of green, a light emitting layers of yellow, a light emitting layers of red, and a light emitting layers of blue;
and the second light emitting layer is a light emitting layer of green, the third light emitting layer is a light emitting layer of blue, the at least one first light emitting layer is a plurality of first light emitting layers, the plurality of the first light emitting layers being a light emitting layer of yellow and a light emitting layer of red.

7. The organic electroluminescence display device as set forth in claim 2, wherein:
each of the light emitting regions includes a thin film transistor.

8. The organic electroluminescence display device as set forth in claim 2, wherein:
the display substrate has a plurality of edges; and
the vapor-deposited films corresponding to each of the at least three colors are formed in a stripe manner from a first edge of the edges to a second edge of the edges, the first edge being orthogonal to a direction in which the light emitting regions of the at least three colors are arranged, the first edge being opposite the second edge.

9. The organic electroluminescence display device as set forth in claim 2 wherein:
the second light emitting layer is a light emitting layer of green, the third light emitting layer is a light emitting layer of blue, the at least one first light emitting layer is a plurality of first light emitting layers, the plurality of the first light emitting layers being light emitting layers of red; and
the light emitting layers are arranged in order of the light emitting layer of red, the light emitting layer of green, the light emitting layer of red, and the light emitting layer of blue.

10. The organic electroluminescence display device as set forth in claim 3, wherein:
the display substrate has a plurality of edges; and
the vapor-deposited films corresponding to each of the at least three colors are formed in a stripe manner from a first edge of the edges to a second edge of the edges, the first edge being orthogonal to a direction in which the light emitting regions of the at least three colors are arranged, the first edge being opposite the second edge.

11. The organic electroluminescence display device as set forth in claim 3 wherein:
the light emitting layers of the light emitting regions of the at least three colors are a light emitting layer of green, a light emitting layer of red, and a light emitting layer of blue in order of descending current efficiencies;
the second light emitting layer is a light emitting layer of green, the third light emitting layer is a light emitting layer of blue, the at least one first light emitting layer is a plurality of first light emitting layers, the plurality of the first light emitting layers being light emitting layers of red; and
the light emitting layers are arranged in order of the light emitting layer of red, the light emitting layer of green, the light emitting layer of red, and the light emitting layer of blue.

* * * * *